United States Patent
Panteleev et al.

(10) Patent No.: US 10,594,339 B2
(45) Date of Patent: Mar. 17, 2020

(54) METHOD FOR GENERATING PARITY CHECK MATRIX FOR LOW DENSITY PARITY CHECK CODING

(71) Applicant: Huawei Technologies Co., Ltd., Shenzhen (CN)

(72) Inventors: Pavel Anatolyevich Panteleev, Odintsovo (RU); Wen Tong, Ottawa (CA); Jiang Li, Moscow (RU); Gleb Vyacheslavovich Kalachev, Moscow (RU); Ivan Leonidovich Mazurenko, Khimki (RU); Elyar Eldarovich Gasanov, Moscow (RU); Aleksey Alexandrovich Letunovskiy, Moscow (RU)

(73) Assignee: Huawei Technologies Co., Ltd., Shenzhen (CN)

( * ) Notice: Subject to any disclaimer, the term of this patent is extended or adjusted under 35 U.S.C. 154(b) by 81 days.

(21) Appl. No.: 15/887,148

(22) Filed: Feb. 2, 2018

(65) Prior Publication Data
US 2018/0226992 A1    Aug. 9, 2018

Related U.S. Application Data

(60) Provisional application No. 62/454,416, filed on Feb. 3, 2017.

(51) Int. Cl.
*H03M 13/11*  (2006.01)
*H03M 13/00*  (2006.01)
*H03M 13/15*  (2006.01)

(52) U.S. Cl.
CPC ...... *H03M 13/116* (2013.01); *H03M 13/1102* (2013.01); *H03M 13/1162* (2013.01);
(Continued)

(58) Field of Classification Search
CPC ......... H03M 13/1162; H03M 13/6362; H03M 13/116; H03M 13/6306; H03M 13/618;
(Continued)

(56) References Cited

U.S. PATENT DOCUMENTS

| 2011/0066916 A1 | 3/2011 | Abu-Surra et al. |
| 2011/0307760 A1 | 12/2011 | Pisek et al. |

(Continued)

FOREIGN PATENT DOCUMENTS

CN    102939720 A    2/2013

OTHER PUBLICATIONS

Chen, J. et al., "Improved Min-Sum Decoding Algorithms for Irregular LDPC Codes," Proceedings of the 2005 IEEE International Symposium on Information Theory, Sep. 2005, 5 pages.
(Continued)

*Primary Examiner* — Cynthia Britt
(74) *Attorney, Agent, or Firm* — Slater Matsil, LLP

(57) ABSTRACT

A method and system for offset lifting is provided. In an embodiment, a method for encoding data includes receiving a K-bit source word input. The method also includes encoding the K-bit source word input according to a LDPC code, a lifting function, and a circulant size offset to generate an N-bit code word output. The circulant size and lifting function are determined according to an information length, a code rate, and a decoder. The method also includes storing the N-bit code word output in input/output memory.

34 Claims, 13 Drawing Sheets

(52) U.S. Cl.
CPC ......... *H03M 13/15* (2013.01); *H03M 13/616* (2013.01); *H03M 13/618* (2013.01); *H03M 13/6306* (2013.01); *H03M 13/6362* (2013.01); *H03M 13/6516* (2013.01)

(58) Field of Classification Search
CPC ........... H03M 13/6516; H03M 13/616; H03M 13/1102; H03M 13/15
See application file for complete search history.

(56) References Cited

U.S. PATENT DOCUMENTS

| | | | |
|---|---|---|---|
| 2013/0139024 | A1 | 5/2013 | Nguyen et al. |
| 2014/0223254 | A1* | 8/2014 | Pisek ................. H03M 13/033 714/755 |
| 2017/0149528 | A1* | 5/2017 | Kim .................... H03M 13/1177 |
| 2018/0175886 | A1* | 6/2018 | Myung ................ H03M 13/116 |
| 2018/0323801 | A1* | 11/2018 | Hsu .................... H03M 13/1162 |
| 2018/0323802 | A1* | 11/2018 | Kalachev ........... H03M 13/1165 |
| 2018/0337691 | A1* | 11/2018 | Kalachev ........... H03M 13/1105 |

OTHER PUBLICATIONS

Fossorier, M.P.C., "Quasi-Cyclic Low-Denisty Parity-Check Codes from Circulant Permutation Matrices," IEEE Transactions on Information Theory, vol. 50, No. 8, Aug. 2004, 6 pages.

Fossorier, M.P.C. et al., "Reduced Complexity Iterative Decoding of Low-Density Parity Check Codes Based on Belief Propagation," Transactioins Papers, IEEE Transactions on Communications, vol. 47, No. 5, May 1999, 8 pages.

"Part 11: Wireless LAN Medium Access Control (MAC) and Physical Layer (PHY) Specifications, Amendment 3: Enhancements for Very High Throughput in the 60 GHz Band," IEEE P802.11ad/D9.0, Draft Standard for Information Technology—Telecommunications and Informational Exchange Between Systems—Local and Metropolitan Area Networks—Specific Requirements, Jul. 2012, 679 pages.

"Part 11: Wireless LAN Medium Access Control (MAC) and Physical Layer (PHY) Specifications Amendment 5: Enhancements for Higher Throughput," IEEE Standard for Information Technology—Telecommunications and Information Exchange Between Systems—Local and Metropoliltan Area Networks—Specific Requirements, IEEE Std 802.11n-2009, 2009, 534 pages.

Paolini, E. et al., "Channel Coding Theory, Algorithms, and Applications: Low-Density Parity-Check Code Contructions," Academic Press Library in Mobile and Wireless Communications, First Edition, Elsevier Science, Jul. 2014, pp. 141-209.

"LDPC design for eMBB," Agenda item: 8.1.3.1, Source: Nokia, Alcatel-Lucent Shanghai Bell, Document for: Discussion and Decision, 3GPP TSG-RAN WG1 #86bis, R1-1609584, Oct. 10-12, 2016, 14 pages.

"Flexibility of LDPC-Length, Rate and IR-HARQ," Agenda Item: 7.1.5.1, Source: Samsung, Document for: Discussion and Decision, 3GPP TSG RAN WG1 #85, R1-164007, May 23-27, 2016, 8 pages.

"LDPC Design Overview," Agenda item: 7.1.5.1, Source: Qualcomm Incorporated, Document for: Discussion/Decision, 3GPP TSG-RAN WG1 #85, R1-164697, May 23-27, 2016, 5 pages.

"Chairmans Notes of Agenda Item 5.1.5 Channel Coding," Agenda item: 5.1.5, Source: Session Chairman (Nokia), Document for: Endorsement, 3GPP TSG RAN WG1 AH_NR Meeting, R1-1701384, Jan. 16-20, 2017, 6 pages.

"Implementation Aspects of LDPC Codes," Agenda Item: 8.1.4.1, Source: Huawei, HiSilicon, Document for: Discussion and Decision, 3GPP TSG RAN WG1 Meeting #88, R1-1701707, Feb. 13-17, 2017, 14 pages.

"Performance Evaluation of LDPC Codes," Agenda Item: 8.1.4.1 , Source: Huawei, HiSilicon, Document for: Discussion and Decision, 3GPP TSG RAN WG1 Meeting #88, R1-1701708, Feb. 13-17, 2017, 13 pages.

Richardson, T.J. et al., "Efficient Encoding of Low-Density Parity-Check Codes," IEEE Transactions on Information Theory, vol. 47, No. 2, Feb. 2001, 19 pages.

Savin, V. et al., "Split-Extended LDPC Codes for coded Cooperation," 2010 International Symposium on Information Theory and its Applications (ISITA), Oct. 17-20, 2010, 6 pages.

Zhang, X., "Binary LDPC Codes & Decoder Architectures: VLSI Architectures for Modern Error-Correcting Codes," CRC Press, 2016, pp. 225-267.

* cited by examiner

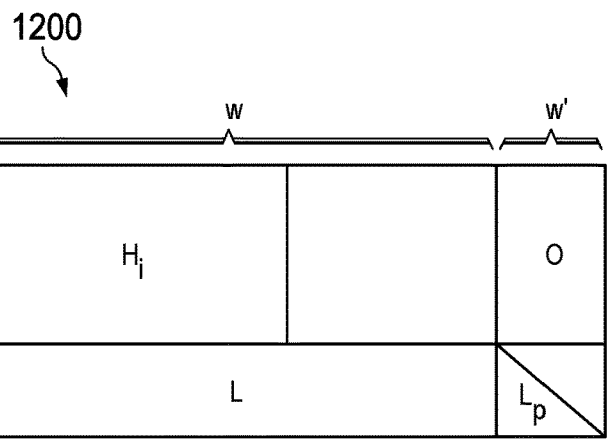
FIG. 12
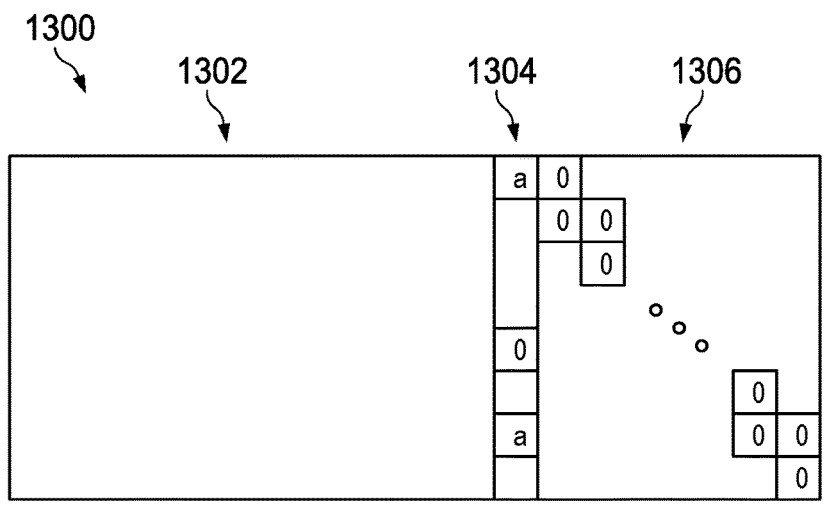
FIG. 13
```
    1400
     ↓
⎧  3   0  -1  -1   2   0  -1   3   7  -1   1   1  -1  -1  -1  -1   1   0  -1  -1  -1  -1  -1
⎪ -1  -1   1  -1  36  -1  -1  34  10  -1  -1  18   2  -1   3   0  -1   0   0  -1  -1  -1  -1
⎪ -1  -1  12   2  -1  15  -1  40  -1   3  -1  15  -1   2  13  -1  -1  -1   0   0  -1  -1  -1
⎨ -1  -1  19  24  -1   3   0  -1   6  -1  17  -1  -1  -1   8  39  -1  -1  -1   0   0  -1  -1
⎪ 20  -1   6  -1  -1  10  29  -1  -1  28  -1  14  -1  38  -1  -1   0  -1  -1  -1   0   0  -1
⎪ -1  -1  10  -1  28  20  -1  -1   8  -1  36  -1   9  -1  21  45  -1  -1  -1  -1  -1   0   0
⎪ 35  25  -1  37  -1  21  -1  -1   5  -1  -1   0  -1   4  20  -1  -1  -1  -1  -1  -1  -1   0   0
⎩ -1   6   6  -1  -1  -1   4  -1  14  30  -1   3  36  -1  14  -1   1  -1  -1  -1  -1  -1  -1   0
```
FIG. 14

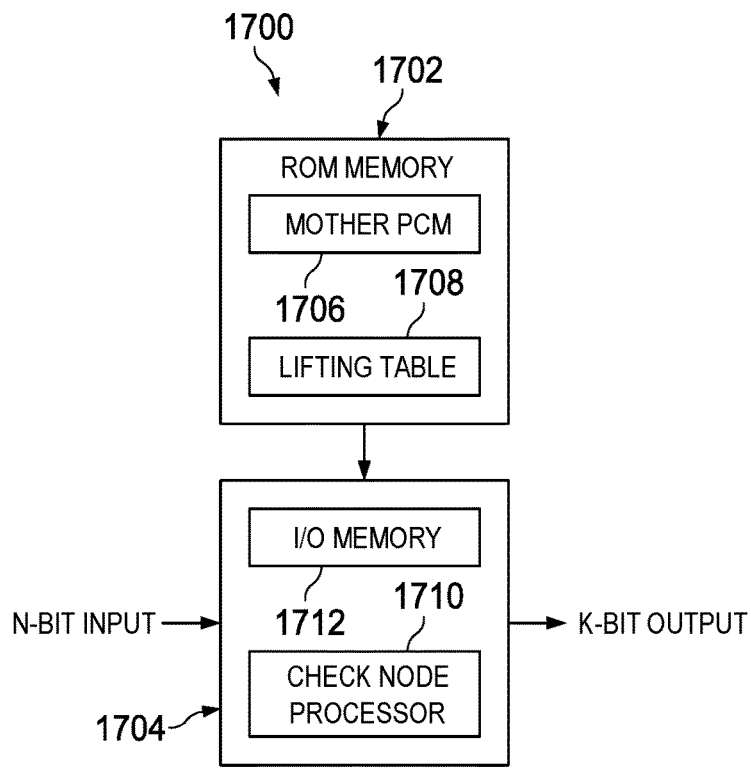
FIG. 17
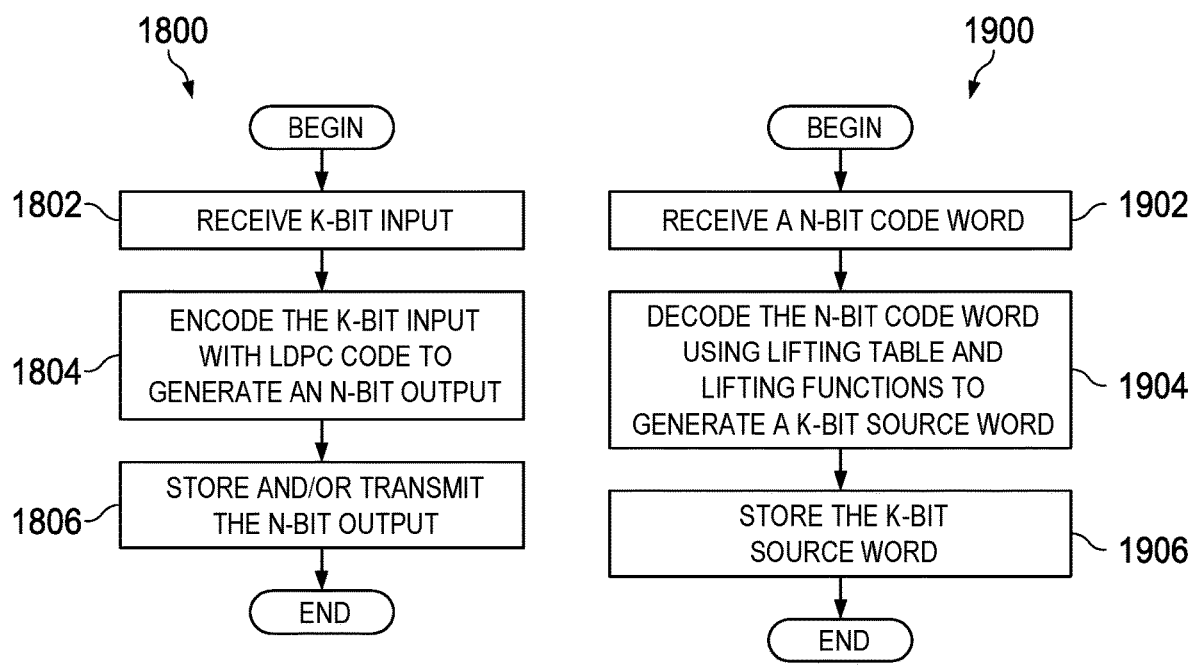
FIG. 18
FIG. 19

FIG. 23

METHOD FOR GENERATING PARITY CHECK MATRIX FOR LOW DENSITY PARITY CHECK CODING

CROSS-REFERENCE TO RELATED APPLICATIONS

This application claims the benefit of U.S. Provisional Application No. 62/454,416, filed on Feb. 3, 2017, which application is hereby incorporated herein by reference.

TECHNICAL FIELD

The present application relates to data storage and communication technologies, in particular to methods and systems for encoding and decoding data using parity check codes.

BACKGROUND

Parity checking codes are used to facilitate the recovery of stored data as well as data transmitted through a communications channel. One type of parity check code is known as Low-Density-Parity-Check (LDPC), which is characterized by a sparse Parity Check Matrix (PCM), i.e., a PCM having a low percentage of 1's. An LDPC encoder at a transmitter is used for encoding source words to generate codewords. An LDPC decoder at a receiver is used for decoding the received codewords. LDPC codes of various rates are being widely adopted, or considered for adoption, in data storage and wireless communications technologies and standards such as those relating to IEEE 802.11 and 5G.

Almost all LDPC codes used in practice are quasi-cyclic (QC) LDPC with QC parity-check matrices, in which a quasi-cyclic identity matrix can be combined with an array of shift information (i.e., QC shift PCM) to define an expanded QC PCM (e.g., a QC LDPC PCM). QC LDPC encoding and recovery algorithms and the storage of PCM information can consume hardware resources, and accordingly there is a need for methods, systems, and technologies that improve the efficiency of and reduce the hardware resources required for QC LDPC coding systems.

SUMMARY

In an embodiment, a method for encoding data includes receiving a K-bit source word input. The method also includes encoding the K-bit source word input according to a LDPC code, a lifting function, and a circulant size offset to generate an N-bit code word output. The circulant size and lifting function are determined according to an information length, a code rate, and a decoder. The method also includes storing the N-bit code word output in input/output memory.

In an embodiment, a method for decoding data includes receiving an N-bit code word input. The method also includes decoding the N-bit code word input according to a LDPC code, a lifting function, and a circulant size offset to generate an K-bit source word output. The circulant size and lifting function are determined according to an information length, a code rate, and a decoder. The method also includes storing the K-bit source word output in input/output memory.

In an embodiment, a network component includes a read only memory comprising at least a parity portion of a mother PCM and a lifting table. The network component also includes a parity bit generator configured to generate parity bits from a source word according to a child code. The child code is determined from the lifting table and the at least a parity portion of the mother PCM. The lifting table includes a combination of circulant size and lifting function according to an information length, a code rate, and a decoder.

In an embodiment, a network component includes a read only memory comprising at least a parity portion of a mother PCM and a lifting table. The network component also includes an input/output memory. The network component also includes a check node processor configured to receive a N-bit code word and determine a K-bit source word according to a child code and store the k=bit source word in the input/output memory. The child code is determined from the lifting table and the at least a parity portion of the mother PCM. The lifting table includes a combination of circulant size and lifting function according to an information length, a code rate, and a decoder.

In an embodiment, a method for lifting a child code from one or more mother codes for encoding data includes calculating a plurality of shifts for a child code using a fixed set of a plurality of lifting functions and a fixed set of allowed circulant size offsets and/or circulant sizes. The method also includes determining a combination of circulant size and lifting function according to a direct simulation, an information length, a code rate, and a decoder. The method also includes storing a circulant size offset and/or circulant size index and a lifting function index corresponding to the determined combination of circulant offset and/or size and lifting function in a lifting table. The circulant offset and/or size index and the lifting function index are used to encode and decode data.

In an embodiment, a network component configured for decoding data includes a processor and a computer readable storage medium storing programming for execution by the processor. The programming includes instructions for calculating a plurality of shifts for a child code using a fixed set of a plurality of lifting functions and a fixed set of allowed circulant sizes. The programming also includes instructions for determining a combination of circulant size and lifting function according to a direct simulation, an information length, a code rate, and a decoder. The programming also includes instructions for storing a circulant size index and a lifting function index corresponding to the determined combination of circulant size and lifting function in a lifting table, the circulant size index and the lifting function index used to encode and decode data.

In an embodiment, a non-transitory computer-readable medium storing computer instructions for decoding data, that when executed by one or more processors, cause the one or more processors to perform a plurality of steps. The steps include calculating a plurality of shifts for a child code using a fixed set of a plurality of lifting functions and a fixed set of allowed circulant sizes. The steps also include determining a combination of circulant size and lifting function according to a direct simulation, an information length, a code rate, and a decoder. The steps also include storing a circulant size index and a lifting function index corresponding to the determined combination of circulant size and lifting function in a lifting table, the circulant size index and the lifting function index used to encode and decode data.

In any of the preceding aspects, circulant size, Z, is limited by a set of allowed values such that Z is in a form $n*2^s$ where n is a positive integer from a fixed set of integers and s is a non-negative integer, such that the options for Z are first 2 or more smallest numbers that have a form of $n*2^s$ and are greater or equal to $Z_{orig}$, wherein $Z_{orig}$ is a minimal possible circulant size to encode the given number of information bits.

In any of the preceding aspects, the parity bit generator is further configured to receive a K-bit source word and determine an N-bit code word according to the mother PCM and the lifting table.

In any of the preceding aspects, shifts of non-zero circulants for predefined positions are unchanged.

In any of the preceding aspects, the lifting table is shared by at least some the one or more mother codes obtained by puncturing parity bits to change the rate of the code.

In any of the preceding aspects, the lifting functions for defining child shifts from the mother shift are defined as selecting the given number of bits from the binary representation of the mother shift at some predefined positions.

In any of the preceding aspects, the lifting functions for defining child shifts from the mother shift are defined by selecting the given number of bits from the binary representation of the mother shift at some predefined positions; and selecting the given number of bits from the binary representation of the mother shift at some other predefined positions.

In any of the preceding aspects, the method further includes repeating the selecting the given number of bits from the binary representation of the mother shift at some other predefined positions several times.

In any of the preceding aspects, each iteration of the selecting the given number of bits from the binary representation of the mother shift at some other predefined positions several times comprises a substep and further comprising summing results of each such substep.

In any of the preceding aspects, the method also includes selecting the given number of bits from the binary representation of the result of the summing at some other predefined positions.

In any of the preceding aspects, the lifting functions for defining child shifts from the mother shift select a fixed number of adjacent bits from a binary representation of the mother shift value.

In any of the preceding aspects, the lifting functions for defining child shifts from the mother shift select the fixed number of most significant bits from the binary representation of the mother shift value.

In any of the preceding aspects, the lifting functions for defining child shifts from the mother shift select the fixed number of least significant bits from the binary representation of the mother shift value.

In any of the preceding aspects, the lifting function firstly selects s bits from the mother shift value at the predefined s bit positions, wherein s corresponds to the minimal power of 2 greater than equal to circulant size Z (i.e. $s=\lceil \log_2(Z) \rceil$), and secondly if this value appears to be greater or equal to Z, selects s−1 bits from the mother shifts at some other predefined s−1 positions.

In any of the preceding aspects, the lifting function firstly selects s least significant bits from the mother shift value, and secondly if this value appears to be greater or equal to Z, it selects s−1 least significant bits from the mother shifts.

In any of the preceding aspects, the circulant size is selected from one of $Z_{orig}$, $Z_{orig}+1$, $Z_{orig}+2$, ..., $Z_{orig}+dZ_{max1}$, wherein $Z_{orig}$ is a minimal possible circulant size to encode the given number of information bits and $dZ_{max1}$ is a positive integer.

In any of the preceding aspects, the circulant size is selected from one of $Z_{orig}$, $GP2(Z_{orig}+1)$, $GP2(Z_{orig}+1)+1$, $GP2(Z_{orig}+1)+2$, $GP2(Z_{orig}+1)+dZ_{max2}$, wherein $Z_{orig}$ is a minimal possible circulant size to encode the given number of information bits, and wherein GP2(A) is a minimal power of 2 greater or equal to A and $dZ_{max1}$ is a positive integer.

In any of the preceding aspects, the circulant size is selected from one of $Z_{orig}$, $GP2(Z_{orig}+1)$, $GP2(Z_{orig}+1)*2$, $GP2(Z_{orig}+1)*4$, ... $GP2(Z_{orig}+1)*2^{dZ_{max3}}$, wherein $Z_{orig}$ is a minimal possible circulant size to encode the given number of information bits, and wherein $dZ_{max3}$ is a positive integer.

In any of the preceding aspects, the circulant size is selected from one of $Z_{orig}$, $Z_{orig}+1$, $Z_{orig}+2$, ..., $Z_{orig}+dZ_{max1}$, $GP2(Z_{orig}+dZ_{max1}+1)$, $GP2(Z_{orig}+dZ_{max1}+1)+1$, $GP2(Z_{orig}+dZ_{max1}+1)+2$, ... m and $GP2(Z_{orig}+dZ_{max1}+1)+dZ_{max2}\}$, wherein $Z_{orig}$ is a minimal possible circulant size to encode the given number of information bits, wherein GP2(A) is a minimal power of 2 greater or equal to A, and wherein $dZ_{max1}$ and $dZ_{max2}$ are positive integers.

In any of the preceding aspects, the circulant size is selected from one of $Z_{orig}$, $Z_{orig}+1$, $Z_{orig}+2$, ..., $Z_{orig}+dZ_{max1}$, $GP2(Z_{orig}+dZ_{max1}+1)*2$, $GP2(Z_{orig}+dZ_{max1}+1)*4$, ..., $GP2(Z_{orig}+dZ_{max1}+1)*2^{dZ_{max3}}$, wherein $Z_{orig}$ is a minimal possible circulant size to encode the given number of information bits, wherein GP2(A) is a minimal power of 2 greater or equal to A, and wherein $dZ_{max1}$ and $dZ_{max3}$ are positive integers.

In any of the preceding aspects, the circulant size is selected from one of $Z_{orig}$, $Z_{orig}+1$, $Z_{orig}+2$, ..., $Z_{orig}+dZ_{max1}$, $GP2(Z_{orig}+dZ_{max1}+1)$, $GP2(Z_{orig}+dZ_{max1}+1)+1$, $GP2(Z_{orig}+dZ_{max1}+1)+2$, ..., $GP2(Z_{orig}+dZ_{max1}+1)\pm dZ_{max2}$, $GP2(Z_{orig}+dZ_{max1}+1)*2$, $GP2(Z_{orig}+dZ_{max1}+1)*4$, ..., $GP2(Z_{orig}+dZ_{max1}+1)*2^{dZ_{max3}}$, wherein $Z_{orig}$ is a minimal possible circulant size to encode the given number of information bits, wherein GP2(A) is a minimal power of 2 greater or equal to A, and wherein $dZ_{max1}$, $dZ_{max2}$, and $dZ_{max3}$ are positive integers.

In any of the preceding aspects, the circulant size is selected from one of $Z_{orig}$, $Z_{orig}+1$, $Z_{orig}+2$, and $Z_{orig}+3$, wherein $Z_{orig}$ is a minimal possible circulant size to encode the given number of information bits.

In any of the preceding aspects, the circulant size is selected from one of $Z_{orig}$ and $Z_{orig}+1$, wherein $Z_{orig}$ is a minimal possible circulant size to encode the given number of information bits.

In any of the preceding aspects, the circulant size is selected from one of $Z_{orig}$, $GP2(Z_{orig}+1)$, $GP2(Z_{orig}+1)+1$, $GP2(Z_{orig}+1)+2$, $GP2(Z_{orig}+1)+6$, wherein $Z_{orig}$ is a minimal possible circulant size to encode the given number of information bits, and wherein GP2(A) is a minimal power of 2 greater than or equal to A.

In any of the preceding aspects, the circulant size is selected from one of $Z_{orig}$, $GP2(Z_{orig}+1)$, $GP2(Z_{orig}+1)+1$, $GP2(Z_{orig}+1)+2$, $GP2(Z_{orig}+1)+3$, wherein $Z_{orig}$ is a minimal possible circulant size to encode the given number of information bits.

In any of the preceding aspects, the circulant size is selected from one of $Z_{orig}$ and $GP2(Z_{orig}+1)$, wherein $Z_{orig}$ is a minimal possible circulant size to encode the given number of information bits.

In any of the preceding aspects, the circulant size is selected from one of $Z_{orig}$, $Z_{orig}+1$, $Z_{orig}+2$, $Z_{orig}+3$, $GP2(Z_{orig}+1)$, $GP2(Z_{orig}+1)+1$, $GP2(Z_{orig}+1)+2$, and $GP2(Z_{orig}+1)+3$.

In any of the preceding aspects, the circulant size is selected from one of $Z_{orig}$, $Z_{orig}+1$, $Z_{orig}+2$, $Z_{orig}+3$, $GP2(Z_{orig}+4)$, $GP2(Z_{orig}+4)+1$, $GP2(Z_{orig}+4)+2$, $GP2(Z_{orig}+4)+3$.

In any of the preceding aspects, the circulant size is selected from one of $Z_{orig}$, $Z_{orig}+1$, $GP2(Z_{orig}+1)$, $GP2(Z_{orig}+1)+1$.

In any of the preceding aspects, the circulant size is selected from one of $Z_{orig}$, $Z_{orig}+1$, GP2($Z_{orig}+2$), GP2($Z_{orig}+2$)+1.

In any of the preceding aspects, the circulant size is selected from one of $Z_{orig}$, $Z_{orig}+1$, $Z_{orig}+2$, GP2($Z_{orig}+3$), GP2($Z_{orig}+3$)+1, GP2($Z_{orig}+3$)+2, GP2($Z_{orig}+3$)+3, GP2($Z_{orig}+3$)*2.

In any of the preceding aspects, the circulant size is selected from one of a fixed number of options, and wherein the number of options is equal to 8, 4 or 2.

The disclosed methods and systems are applicable to any QC-LDPC code and provides 1) avoidance of "catastrophic" cases in length adaption scheme (e.g., when some simple modulo/floor or other lifting code with Z=Zorg produces very poor performance); 2) improved error floor performance; and 3) a nested QC-LDPC code design which is optimized for all possible information length K and rates having the disclosed lifting schemes as a target. Furthermore, these advantages are provided with low additional hardware cost.

BRIEF DESCRIPTION OF THE DRAWINGS

For a more complete understanding of the present invention, and the advantages thereof, reference is now made to the following descriptions taken in conjunction with the accompanying drawings, in which:

FIG. 12 is a diagram of an embodiment of a lower triangular extension for each parity-check matrix $H_i$;

FIG. 13 is a diagram showing an embodiment of an IRA LDPC parity-check matrix structure;

FIG. 14 depicts a table showing an example of a QC matrix with IRA structure;

FIG. 17 is a block diagram of an embodiment of an LDPC decoder;

FIG. 18 is a flowchart of an embodiment of a method for encoding data using LDPC, the disclosed lifting tables, and the disclosed lifting functions;

FIG. 19 is a flowchart of an embodiment of a method for decoding data using LDPC, the disclosed lifting tables, and the disclosed lifting functions;

FIG. 23 illustrates a table showing non-zero circulants with fixed positions.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Disclosed herein are systems, methods, and devices for encoding/decoding data using LDPC. Various embodiments include offset lifting procedures to determine a circulant offset to encode/decode data. Furthermore, various embodiments include non-sequential circulant offsets and larger circulant offsets than the prior art. Various embodiments also include multiple lifting functions. Having large circulant offsets allows the offset to be determined more quickly and consumes fewer system resources than the prior art methods (e.g., less amount of offline simulations during lifting table construction, less memory needed to store the lifting table in the encoder/decoder, etc.). Furthermore, different lifting functions may be better suited for encoding different length code words.

Figure 1:
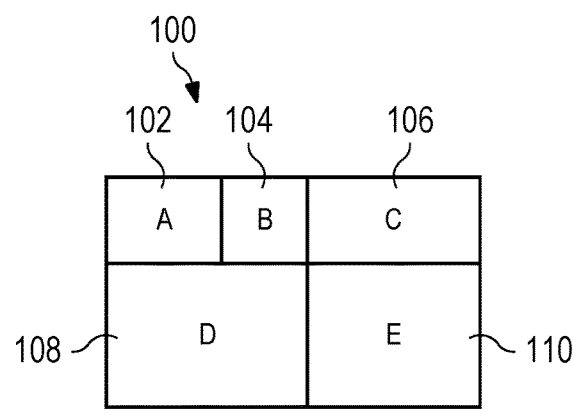
FIG. 1 is a diagram of an embodiment of a parity check matrix.

FIG. 1 is a diagram of an embodiment of a parity check matrix mo. In an embodiment, for at least one base graph, the parity check matrix includes five sub-matrices identified as A 102, B 104, C 106, D 108, and E 110. Sub-matrix A 102 may contain systematic and parity bits.

Figure 2:
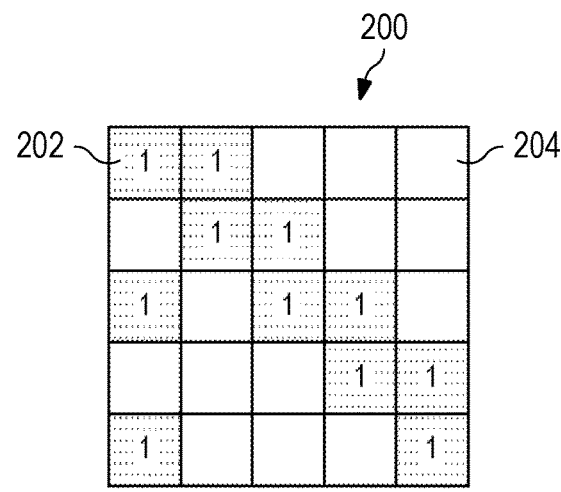
FIG. 2 is a diagram of an embodiment of a sub-matrix B.

FIG. 2 is a diagram of an embodiment of a sub-matrix B 200. Sub-matrix B 200 is not necessarily square. Sub-matrix B 200 includes elements 202 of 1's and empty elements 204. One of the columns 206 of sub-matrix B 200 has a weight of three. The columns 208, 210, 212, 214 of sub-matrix B 200 after the weight-three column 206 have a dual diagonal structure.

Returning to FIG. 1, sub-matrix C 106 is a zero matrix. Sub-matrix E 110 is an identity matrix. In other aspects, other structures can be considered for other base graphs, if any.

Disclosed herein are a nested family of irregular QC LDPC codes obtained from one high rate base matrix that follows the working assumption described above with respect to FIGS. 1 and 2, and a quasi row orthogonal structure to make a trade off between performance and complexity.

Description for LDPC Rate Matching

Single parity check (SPC) extension is a common method for LDPC to realize rate matching which is called Raptor-like structure or Nested Base graph structure. This method has been adopted by several companies. It usually starts from a high rate LDPC matrix with dual-diagonal or lower triangular structure. To achieve lower rate, the high rate matrix is extended with one single parity check equation and one parity bit at a time.

LDPC Design

In an embodiment, a Quasi-Cyclic (QC) LDPC codes with QC parity-check matrices is used, where each circulant is either a circulant permutation matrix (CPM) or the zero matrix. Usually a quasi-cyclic $m_b Z \times n_b Z$ parity-check matrix (PCM) H with $m_b$ circulant row blocks, $n_b$ circulant column blocks, and the circulant size Z is represented in the following form:

$$H = \begin{bmatrix} e^{p_{11}} & e^{p_{12}} & \cdots & e^{p_{1n_b}} \\ e^{p_{21}} & e^{p_{22}} & \cdots & e^{p_{2n_b}} \\ \vdots & \vdots & \ddots & \vdots \\ e^{p_{m_b 1}} & e^{p_{m_b 2}} & \cdots & e^{p_{m_b n_b}} \end{bmatrix}$$

where the integers $p_{ij}$ are in the range $[-1, Z-1]$. Here we denote by $e^{p_{ij}}$ the $Z \times Z$ CPM corresponding to the right cyclic shift by $p_{ij}$ positions if $0 \leq p_{ij} < Z$ and the $Z \times Z$ zero matrix if $p_{ij} = 1$. We call the integers $p_{ij}$ exponents and the corresponding $m_b \times n_b$ integer matrix $E(H) = (p_{ij})_{m_b \times n_b}$ the exponent matrix of H. In what follows we usually define QC LDPC codes and their PCMs by the corresponding exponent matrices.

Nested QC LDPC Code

Figure 3:
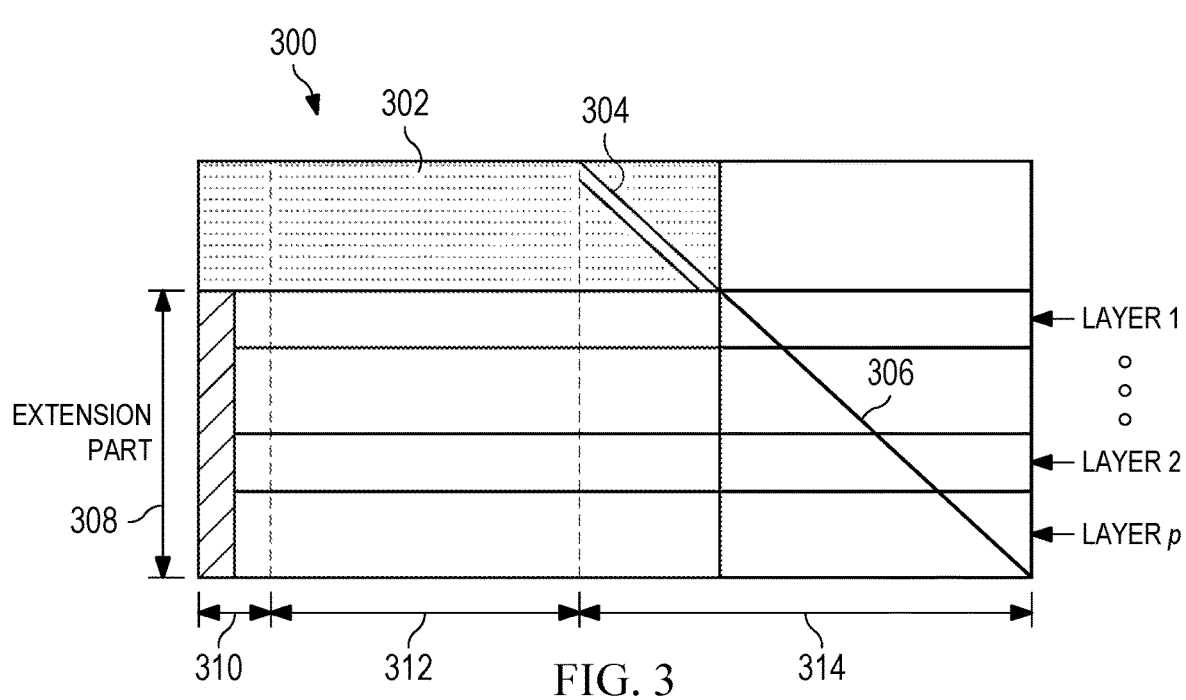
FIG. 3 is a diagram of an embodiment of a quasi-cyclic (QC) matrix with a quasi row orthogonality (QRO) property in the extension part.

FIG. 3 is a diagram of an embodiment of a QC matrix 300 with QRO property in the extension part. Disclosed herein is a nested family of irregular QC LDPC codes obtained from one high-rate base code as an extension by several single parity-check codes (SPCs). The QC matrix 300 includes a base matrix 302, dual-diagonal structure 304, an identity matrix 306 and an extension part 308 that includes layers 1, 2, ... p. QC matric 300 also includes two punctured circulant blocks 310, information bits 312, and parity bits 314 as shown in FIG. 3. The general structure of the corresponding exponent matrices is shown in FIG. 3, where the base matrix 302 is the shaded upper left part of QC matrix 300 and corresponds to the base code. The extension part 308 is the lower portion of QC matrix 300. In an aspect, it is disclosed to use base matrices with dual-diagonal structure in their parity part. It is also easy to see that the full matrix 300 with the extension part 308 also supports a low-complexity encoding. In an aspect, the number of information columns is set to 16 in order to achieve the peak throughput of 20 Giga bits per second (Gbps) with more parallelism.

In order to obtain codes with different number of information bits K and parity bits N, a length and rate adaption scheme is used, of which a more detailed description is provided below. This is achieved by using puncturing both information and parity bits, and also shortening by zero padding in the information parts of the codeword. In various aspects, in all the codes for all rates, symbols are punctured that correspond to the first two circulant column blocks as it is shown in FIG. 3. The first of these two punctured circulant columns 310 has the highest column weight among all the circulant columns 310 and is called the High-Weight (HW) column. The structure of base matrix 302 is similar to the structure utilized in the PCMs for QC LDPC codes described in the IEEE 802.11ad™-2012 standard.

In order to obtain a high level of parallelism during the decoding, the structure of the extension part 308 is further restricted. A group of rows in the extension part 308 has the feature of quasi row orthogonality (QRO) if for each pair of different rows in this group they are allowed to have more than one common positive entries (not equal to −1) only in the HW circulant column (see FIG. 3). It is worth noting that a block-parallel decoder could encounter fewer conflicts if multiple cores (blocks) are processed simultaneously, thanks to the QRO structure. To go a step further, one can also design the rows at the border of two neighboring groups such that they are not overlapped except for HW columns such that the implementation is more flexible, which is defined as a Non-Conflict (NC) property.

In an aspect, exponent matrices with several groups of quasi orthogonal rows in the extension part 308 are used and such matrix is said to have the quasi row orthogonal structure.

Figure 4:
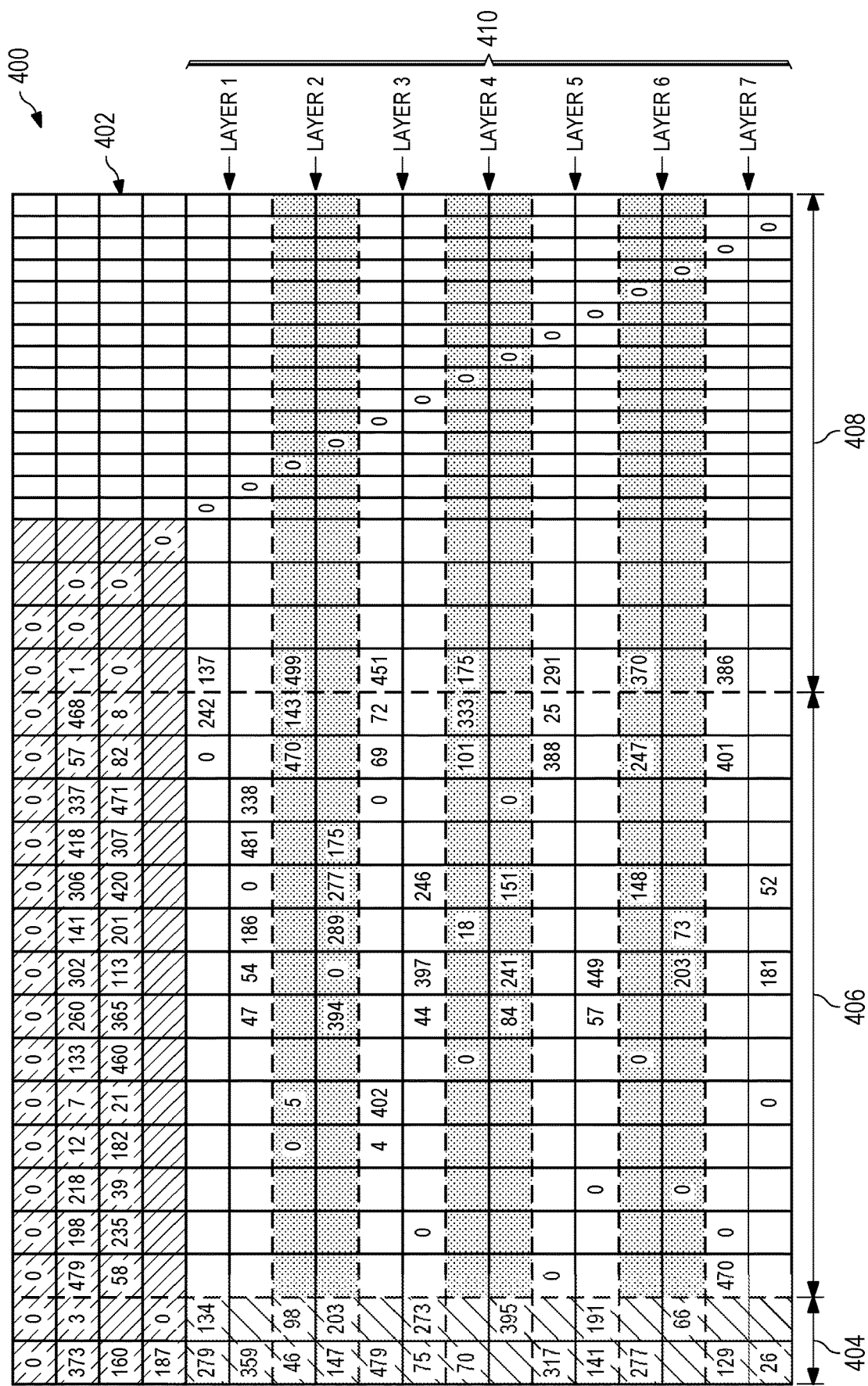
FIG. 4 is an example of a QC matrix with QRO property in the extension part.

FIG. 4 is an example of a QC matrix 400 with QRO property in the extension part. ZC matrix 400 is a simple example of an exponent matrix with QRO structure (all empty cells contain −1). QC matrix 400 includes a base matrix 402, an extension part 410, two punctured circulant blocks 404, information bits 406, and parity bits 408. QC matrix 400 is similar to QC matrix 300. In the depicted example, there are 7 layers in the extension part 410 of the matrix 400.

The disclosed methods, systems, and schemes can be efficiently implemented in hardware by fully utilizing the QRO structure of the non-punctured parts of the PCM rows. As a result, a flexible trade-off between high throughput and good performance can be obtained. Low complexity of the routing network is also achievable by using multiple block processors. In an embodiment, this is done with several blocks of each non-overlapping group/layer of rows in parallel.

Quasi row orthogonal structured LDPC code provides a flexible trade-off between high throughput and good performance for large block size.

In an embodiment, Quasi row orthogonal structure and compact base matrix are used for LDPC codes in NR.

Lifting Method, Length and Rate Adaptation

Shortening, puncturing and lifting method are used for QC LDPC code to implement length and rate adaptation. In an example, suppose one has an exponent matrix $(p_{ij})_{m_b \times n_b}$ with the circulant size $Z_{max}$. Below, an exemplary method for obtaining the (N, K)-code with codeword size N and information block size K, where $100 \leq K \leq 8192$ is decribed.

In an aspect, the lifting method described below is used to obtain the lifted version of the exponent matrix $(p'_{ij})_{m_b \times n_b}$ with the circulant size Z, $Z \leq 512$. Such method improves the performance with fine granularity.

Assume $Z_{orig} = \lceil K/k_b \rceil$, where $k_b = n_b - m_b$. We set $Z = Z_{orig} + \Delta Z$ and $P'_{ij} = p_{ij} \bmod 2^s$, where $\Delta Z \in \{0, 1, 2, 3, 2^t - Z_{orig}, 2^t - Z_{orig} + 1, 2^t - Z_{orig} + 2, 2^t - Z_{orig} + 3\}$, s is the maximal possible integer such that $2^s \leq Z$ and t is the minimal possible integer such that $Z_{orig} + 4 \leq 2^t$.

In an aspect, the additional parameter $\Delta Z$ used here is selected based on the performance of the corresponding matrices in the simulations (SNR needed to obtain BLER=$10^{-2}$ and BLER=$10^{-4}$) and can be calculated offline for each $Z_{orig}$. Thus, in an aspect, it is only necessary to store no more than $3 \cdot Z_{max}$ bits for these parameters (three bits for each $Z_{orig}$). For example, for the nested family the following table can be used for $\Delta Z$:

TABLE 1

Example of offset value and parameters.

| $Z_{orig}$ | ΔZ index (3 bit value) | Automatically calculated parameters | | | |
|---|---|---|---|---|---|
| | | ΔZ | $Z = Z_{orig} + ΔZ$ | s | K |
| 2 | 5 | 7 | 9 | 3 | 32 |
| 3 | 6 | 7 | 10 | 3 | 33-48 |
| 4 | 4 | 4 | 8 | 3 | 49-64 |
| 5 | 3 | 3 | 8 | 3 | 65-80 |
| 6 | 2 | 2 | 8 | 3 | 81-96 |
| 7 | 3 | 3 | 10 | 3 | 97-112 |
| 8 | 3 | 3 | 11 | 3 | 113-128 |
| ... | ... | ... | ... | ... | ... |
| 512 | 0 | 0 | 512 | 9 | 8177-8192 |

Puncturing and Shortening

Once the lifted exponent matrix $(p'_{ij})_{m_b \times n_b}$ and the circulant size Z are obtained by the method described above, define the code with codeword size $(n_b-2) \cdot Z$ and information block size $k_b \cdot Z$ obtained by puncturing the bits corresponding to the first two circulant columns (see FIG. 3). The parameters are defined as follows: $ΔK=k_b \cdot Z-K$ and $ΔN=(n_b-2) \cdot Z-N-ΔK$.

If ΔN>0, then further puncture ΔN redundant bits starting from the end of the codeword. After applying the puncturing described above, the punctured codeword is obtained. If ΔK>0, then further shortening is performed by zero padding for the last ΔK bits in the punctured codeword.

Performance with Fine Granularity

Figure 5:
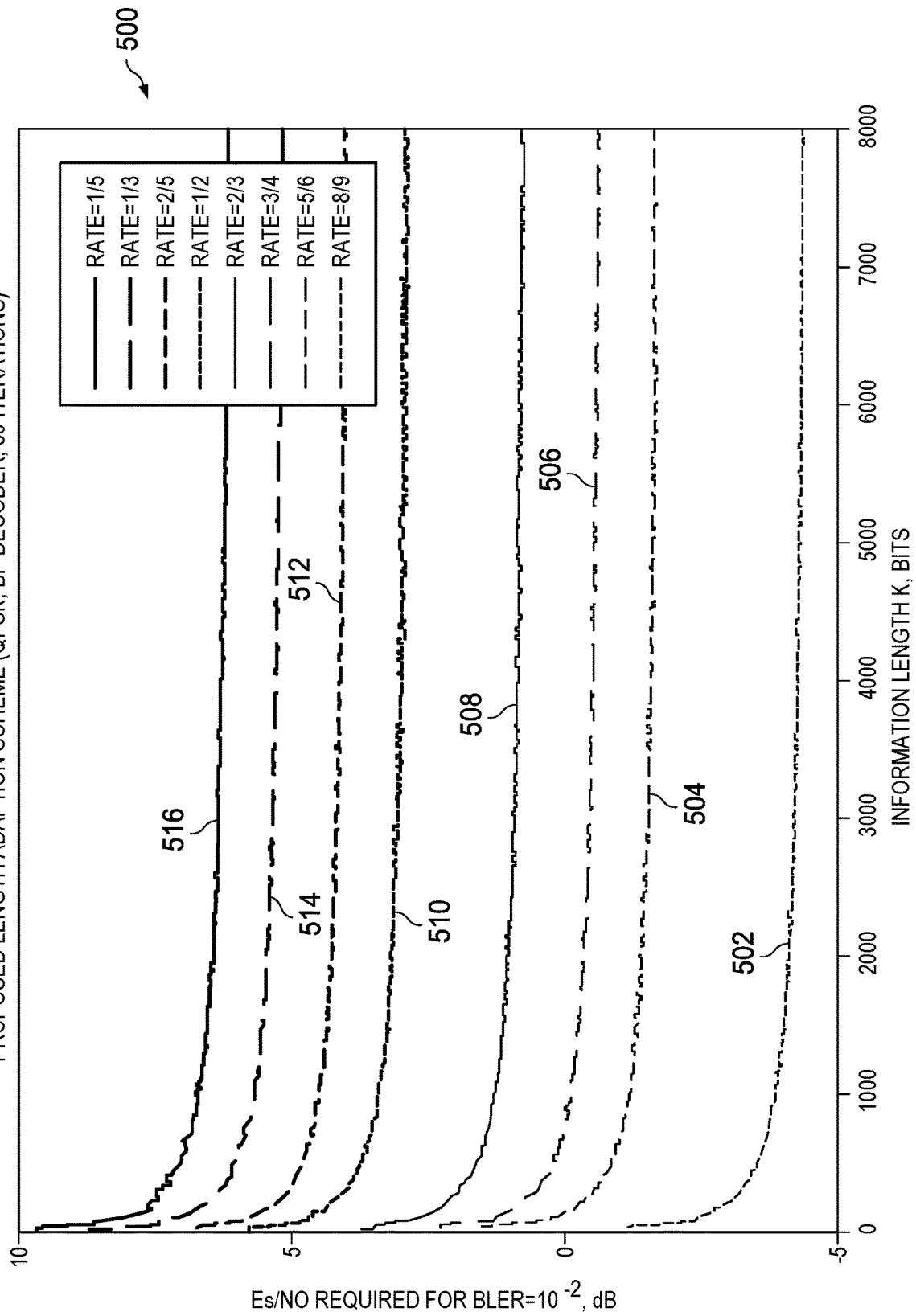
FIG. 5 is a graph showing performance of an embodiment of a length adaption scheme, Es/No(dB) at BLER=$10^{-2}$.
Figure 6:
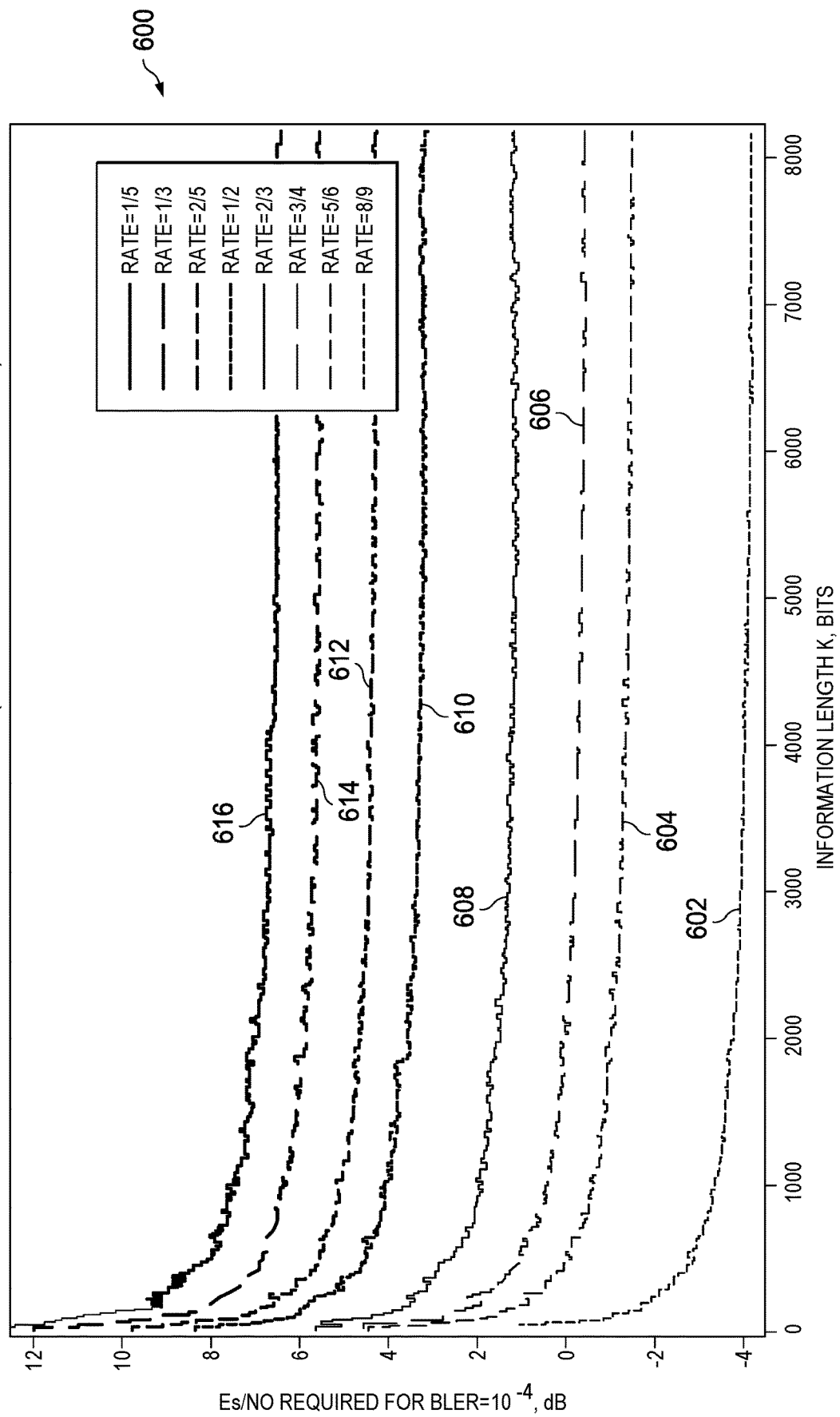
FIG. 6 is a graph showing performance of an embodiment of a length adaption scheme, Es/No(dB) at BLER=$10^{-4}$.

FIGS. 5 and 6 show the simulation results for the length adaption scheme applied to the nested family of QC LDPC codes.

FIG. 5 is a graph 500 showing performance of an embodiment of a length adaption scheme, Es/No(dB) at BLER=$10^{-2}$. The various curves 502, 504, 506, 508, 510, 512, 514, 516 correspond to rates of 1/5, 1/3, 2/5, 1, 2/3, 3/4, 5/6, and 8/9 respectively. Each curve 502, 504, 506, 508, 510, 512, 514, 516 is a plot of Es/No(dB) as a function of information length K in bits at BLER $10^{-2}$. A BP decoder is used in the evaluation.

FIG. 6 is a graph 600 showing of an embodiment of a length adaption scheme, Es/No(dB) at BLER=$10^{-4}$. The various curves 602, 604, 606, 608, 610, 612, 614, 616 correspond to rates of 1/5, 1/3, 2/5, 2, 2/3, 3/4, 5/6, and 8/9 respectively. Each curve 602, 604, 606, 608, 610, 612, 614, 616 is a plot of Es/No(dB) as a function of information length K in bits at BLER $10^{-4}$. BP decoder is used in the evaluation.

As can be seen from the FIGS. 5 and 6, the disclosed lifting method allows a very smooth transition from one circulant size to another with no visible catastrophic cases for all rates and all information block sizes.

The length adaptation scheme described above supports fine granularity and avoids catastrophic cases for different lengths and rates. It also allows a simple hardware implementation.

In an aspect, the lifting method described above is used for LDPC codes in NR.

IR-HARQ and Retransmission

Figure 7:
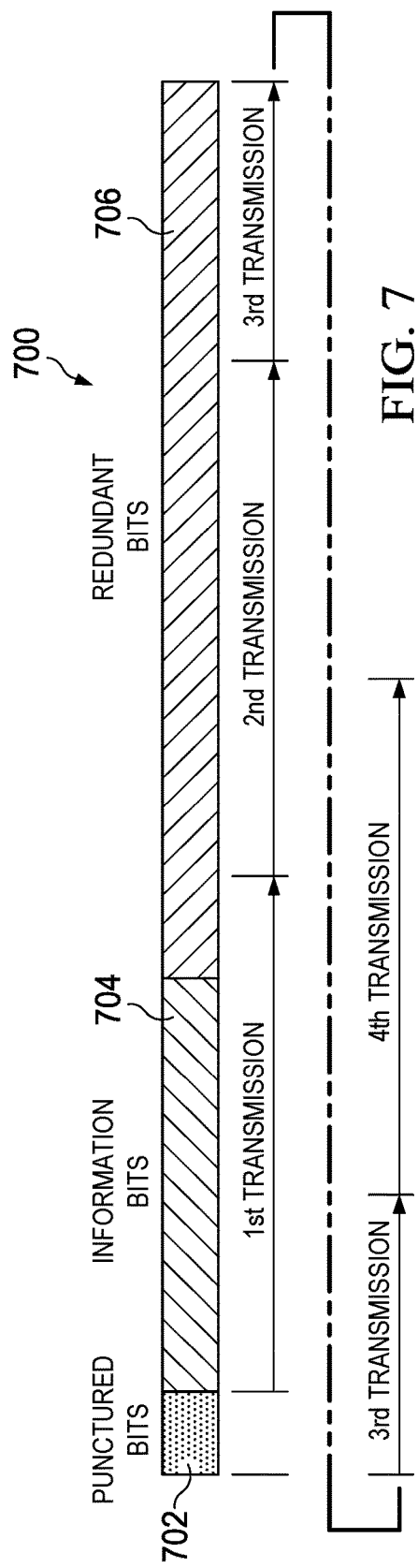
FIG. 7 is a diagram of an embodiment of an incremental redundancy hybrid automatic repeat request (IR-HARQ)

FIG. 7 is a diagram of an embodiment of an incremental redundancy hybrid automatic repeat request (IR-HARQ) 700. IR-HARQ 700 includes punctured bits 702, information bits 704, and redundant bits 706.

Since the structure of proposed matrix is a combination of 802.11n like matrix and single extension part, the transmitter can firstly encode the codeword for the lowest code rate and store it in a circular buffer. According to the desired code rate, a codeword with a certain length is sent excluding filling bits and the first 2Z information bits. In an aspect, to maintain good performance of LDPC, each retransmission (e.g., $2^{nd}$, $3^{rd}$, and $4^{th}$ transmissions in FIG. 7) should start at or near where the last transmission ends, as shown in FIG. 7. Thus, for example, the 2n transmission starts where the $1^{st}$ transmission ends. In this manner, IR-HARQ and rate-matching can be easily achieved.

The disclosed LDPC code with raptor-like structure can support multiple code rates and IR-HARQ using circular buffer.

This disclosure describes a design of QC LDPC code for eMBB. It is shown that this design of LDPC code has good performance and supports the fine-granularity rate-matching scheme for all scenarios of eMBB channel. Quasi row orthogonal structured LDPC code provides a flexible trade-off between high throughput and good performance for large block size. The length adaptation scheme described above supports fine granularity and avoids catastrophic cases for different lengths and rates. It also allows a simple hardware implementation.

Figure 8:
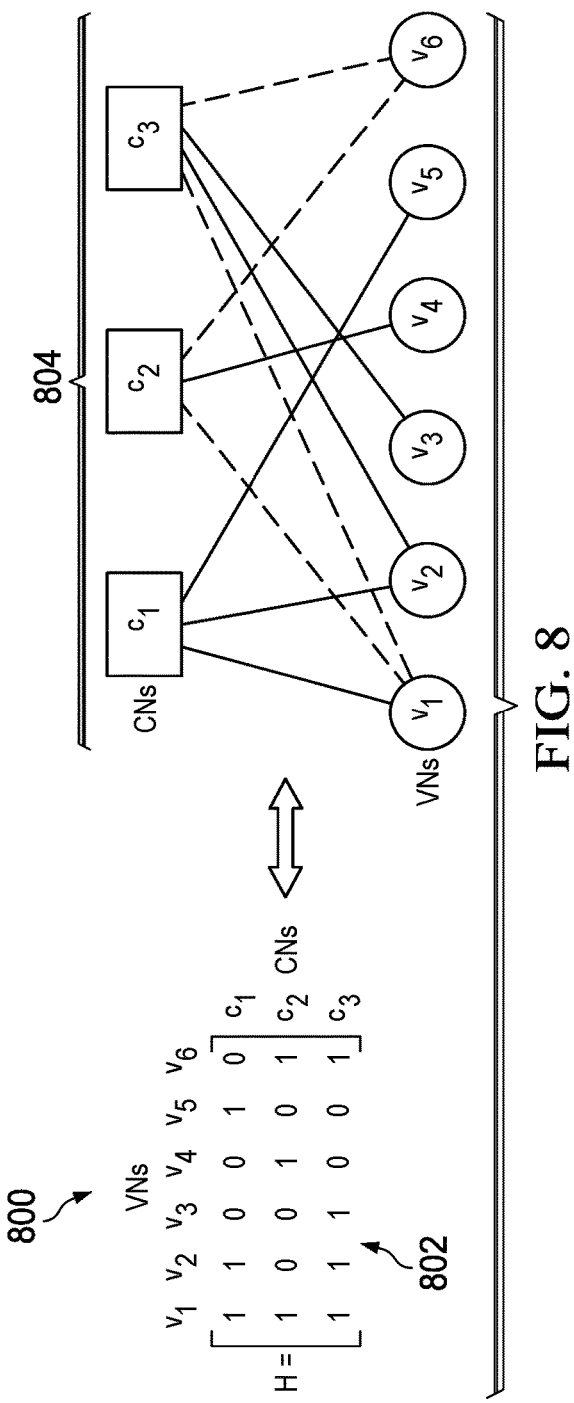
FIG. 8 is a diagram showing a 3 by 6 parity check matrix (PCM), H, and its corresponding Tanner graph representation.

FIG. 8 is a diagram 800 showing a 3 by 6 parity check matrix (PCM), H, 802 and its corresponding Tanner graph representation 804. An LDPC code is defined by a sparse parity check matrix (PCM), which is an (N–K) row by N column matrix, where N is the codeword size (number of bits in a codeword) and K is the information block size of a source word (number of message bits in each codeword). A Tanner graph 804 is a graphical representation of the parity check matrix specifying the parity check equations. In the depicted example, the Tanner graph 804 includes three check nodes (CNs) $c_1$, $c_2$, and $c_3$ and six variable nodes (VNs) $v_1$, $v_2$, $v_3$, $v_4$, $v_5$, and $v_6$. A Tanner graph consists of N variable nodes (VNs) and M check nodes (CNs). In the depicted example, the Tanner graph 804 includes three CNs $c_1$, $c_2$, and $c_3$ and six VNs $v_1$, $v_2$, $v_3$, $v_4$, $v_5$, and $v_6$. In the Tanner graph 804 shown in FIG. 8, the $m^{th}$ check node is connected to the $n^{th}$ variable node if, and only if, the $n^{th}$ element, $h_{mn}$, in the $m^{th}$ row in the parity check matrix, H, is 1.

Figure 9:
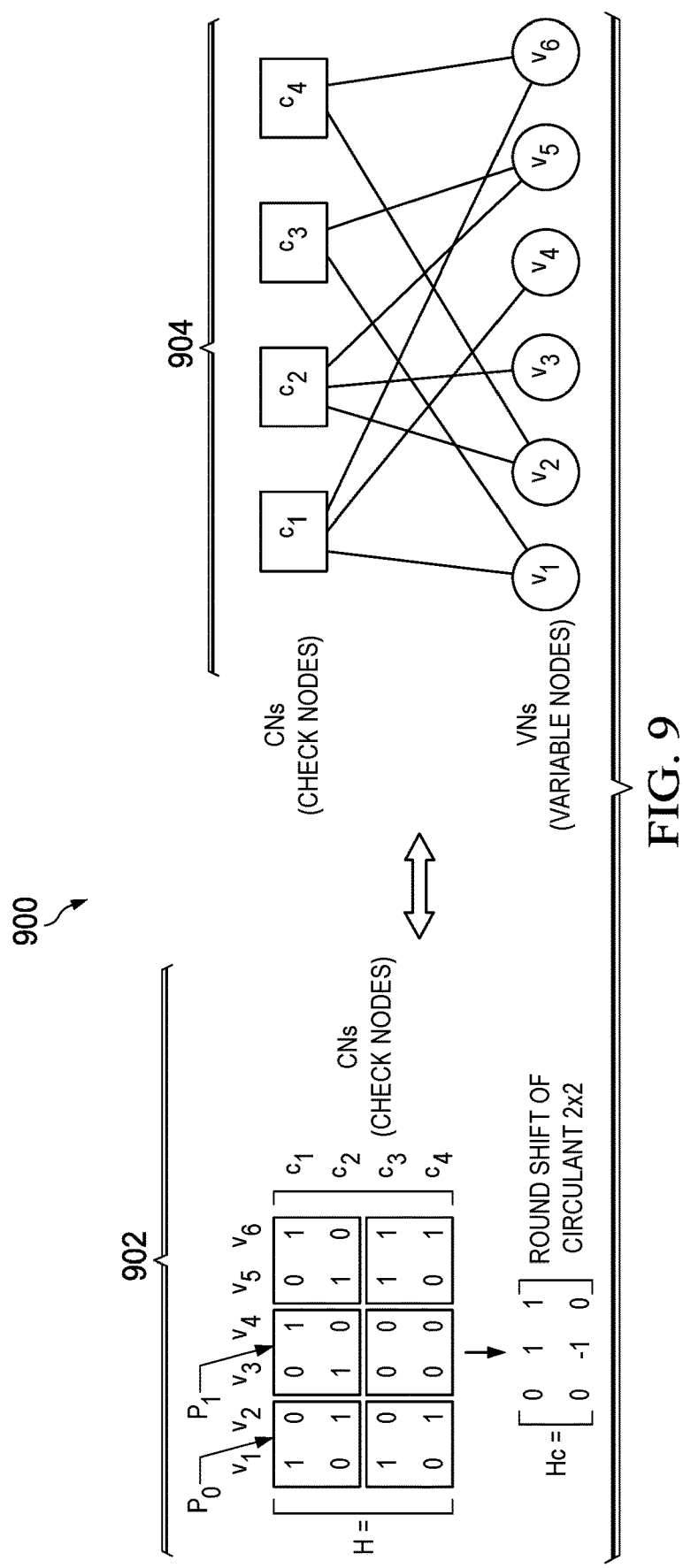
FIG. 9 is a diagram showing a 4 by 6 PCM, H, and its corresponding Tanner graph representation.

FIG. 9 is a diagram 900 showing a 4 by 6 PCM, H, 902 and its corresponding Tanner graph representation 904. A receiving entity can decode received code words that have been encoded in accordance with PCM H by applying the PCM H in combination with a message passing algorithm (MPA). As illustrated in the example of FIG. 9, LDPC decoding with MPA is an iterative decoding algorithm that uses the structure of the Tanner graph 904. In an LDPC decoder, each $m^{th}$ check node ($C_1$, $C_2$, $C_3$) is connected to the $n^{th}$ variable node ($V_1$, . . . , $V_6$) if and only if the $n^{th}$ element h, in the $m^{th}$ row in the PCM H is 1.

For practical application, PCMs are typically configured as a more structured matrix rather than a simple collection of binary ones and zeros. For example, a more structured matrix is used to support a type of LDPC codes referred to as Quasi-Cyclic (QC) LDPC that are produced by cyclic permutation matrices with column weight 1. In particular, as shown in FIG. 9, LDPC PCM H can be partitioned into a set of square sub-matrices $P_i$ of size Z×Z that are either cyclic-permutations of an identity matrix $P_o$ or null submatrices with all zero entries. The matrix dimension Z of the QC sub-matrix is referred to as the circulant size and is also known as a lifting factor. The identity matrix $P_o$ has "1" entries on the diagonal from the top left corner to the bottom right corner and "0" entries everywhere else. An index value i can be used to denote the cyclic-permutation submatrix $P_i$ obtained from the Z×Z identity matrix $P_o$ by cyclically shifting the columns to the right by i elements. By way of example, FIG. 9 illustrates 4 by 6 LDPC PCM H partitioned into a set of 2 by 2 square submatrices. The submatrix $P_o$ is an identity matrix, and submatrix P, is obtained by cyclically shifting the columns of submatrix $P_o$ to the right by 1. QC LDPC allows large PCMs to be represented as smaller structured PCMs with each Z×Z submatrix represented by its index value i in a corresponding cell location of a QC PCM. By way of example, in FIG. 9, the 4 by 6 PCM H can be restated as (and thus generated from) a 2 by 3 QC PCM $H_c$ in which each cell includes with an cyclic shift index value or a null value. As used herein, H may be referred to as a protograph of the code (i.e., protograph matrix). Converting from H to $H_c$ is typically referred to as "edge labeling" or simply "labeling." Also, as used herein, $H_c$ may be referred to as a labelled protograph or a labelled matrix.

QC LDPC codes are usually decoded by a message passing decoder such as BP, Min-Sum, and their modifications (NMSA, OMSA, ... ). Performance of the QC LDPC code depends on multiple factors like row and column weight distribution (typically optimized using Density evolution methods), code distance, amount of short cycles and trapping sets etc. However, prior art encoding/decoding systems and algorithms and storage of the PCM information consume large amounts of system resources.

Additionally, to support information length fine granularity and rate adaption, nested family of the codes may be used, where rate and length adaption is performed by puncturing (removing) parity bits and shortening (zero-padding) information bits. Accordingly, simple and powerful lifting method are needed to construct child PCMs from a single parent PCM.

As noted above, storage and use of QC PCM information can be resource intensive. Accordingly, embodiments of the present disclosure provide a QC PCM method and system that allows the same QC PCM information to be adaptively used to support a range of different information rates and information block sizes K. Accordingly, methods and systems are disclosed herein that relate to shortening, puncturing and lifting QC LDPC codes. Shortening means padding information bits with zeros to match exactly the given rate (these bits are not transmitted but used by both encoder and decoder as zeros). Shortened bits may be padded from the left, the right side of the information block, or even from somewhere in the middle. Puncturing means removing some non-needed parity check bits to increase the rate of the code. This corresponds to cutting the last several columns and the same number of rows from the PCM.

To support information length fine granularity and rate adaption, nested family of the codes may be used, where rate and length adaption is performed by puncturing parity bits and shortening information bits. Accordingly, simple and powerful lifting methods are described herein to construct child PCMs from one or several parent PCMs.

Example embodiments are directed to an advanced lifting method that provides one or more of the following features: (i) high performance for every information block size K with 1 bit granularity; (ii) low hardware complexity; and (iii) need to store only one PCM or a limited set of PCMs in memory. In some examples, a simple modulo based formula is used for obtaining child matrix shifts from a parent shift. As a result, a parent PCM can be sued with a relatively small data table (also referred to herein as a "lifting table") to support multiple different circulant sizes Z. The table can be constructed in offline by direct simulation, and may be tuned for specific decoder, range of rates, lengths and number of iterations. In example embodiments, modulos may be selected from a limited set of hardware-friendly values like $2^s$ or $n*2^s$ where s and n are natural numbers.

Accordingly, in example embodiments, a data set in the form of a table is generated that specifies variables that can be used to modify a parent PCM to optimally support different data rates and information block sizes. In particular, for each rate and information block size K, a circulant size Z and a modulo $M=n*2^s$ selected (using performance simulations in offline) from the following options:

Options for Circulant Size Z:

$$Z=Z_{min}, Z_{min}+1, \ldots Z_{min}+\Delta Z_{max}$$

Where:
$\Delta Z_{max}$ is a positive integer, for example: $\Delta Z_{max}=1$ or $\Delta Z_{max}=2$ $Z_{min}=\lfloor K/Kb \rfloor$;
K=number of information bits (information block size) and
Kb—# of information columns
Options for n: $n \in \{n_1, n_2, \ldots n_t\}$
Simplest case: n is always 1. Other examples: $n \in \{3,4,5,7\}$
For each option we set $s=\lfloor \log_2 (Z/n) \rfloor$
Options for Modulo M:

$$M=n*2^s, M=n*2^{s-1}, \ldots M=n*2^{s-\Delta smax}$$

where $\Delta s_{max}$ is 0 or a positive integer, for example: $\Delta s_{max}=1$ or $\Delta s_{max}=0$ or $\Delta s_{max}=2$ Lifting formula: circulant size: Z, shift=$shift_{parent}$ mod M Based on simulations, values n, $\Delta Z$ and $\Delta s$ are selected so that:

$$Z=Z_{min}+\Delta Z, s=\lfloor \log_2(Z/n) \rfloor$$

$$M=n*2^{s-\Delta s}$$

In example embodiments, simulations are done for the specific types of decoder (e.g. BP, MinSum, LOMS etc.) and a specific number of iterations (e.g. 15) with specific parameters, and the results are then used to build a lifting table, a representation of which can be as follows: Table 1: Lifting Table

TABLE 1

Lifting Table

| $Z_{min}$ | $\Delta Z$ | $\Delta s$ | n |
|---|---|---|---|
| 2 | 0 | 1 | 1 |
| 3 | 1 | 0 | 2 |
| ... | ... | ... | |

The size of the lifting table can be determined as follows:

Size of Table 1: $\lceil \log_2(1+\Delta Z_{max}) \rceil * \lceil \log_2(1+\Delta s_{max}) \rceil *nZ*nN$ Where:
nZ is a number of options for different $Z_{min}$
nN is a size of a set $\{n_1, n_2, \ldots n_t\}$ of options for n (For example, if $\Delta Z_{max}=1$, $\Delta s_{max}=1$, $\Delta N=1$, nZ=100, and nN=1, table size is 2*2*100=400 bits)

Parent PCM design of a rate adaptive code can be done using PEG-based (progressive edge growth) methods where the following steps are involved:
Finding the column and row weight distribution (for example using DE—density evolution)
Finding a protograph using PEG procedure. In an embodiment, the protograph is a substantially best or preferred protograph.

Labeling (finding the lifting values for each non-zero circulant)

With respect to Labeling, several options for lifts are explored to find the best or a preferred one. If it is known in advance that all shifts are from [0 . . . n*2$^s$−1], much fewer number of options need to be explored which makes PCM design more efficient.

A further explanation of shortening, puncturing and lifting methods used for QC LDPC code to implement length and rate adaptation will now be provided in the context of an exponent matrix $(p_{ij})_{m_b \times n_b}$ with the circulant size $Z_{max}$. The following explains how to obtain the (N, K)-code with codeword sizeN and information block sizeK, where for example 100≤K≤8192.

First, the lifting method described below is used to obtain the lifted version of the exponent matrix $(p'_{ij})_{m_b \times n_b}$ with the circulant size Z, for example Z≤512. Let $Z_{min}$ be the minimal possible circulant size for the given information block size K, i.e. $Z_{min}$=⌈K/k$_b$⌉, where $k_b$=$n_b$−$m_b$. Values are set as follows: Set Z=$Z_{min}$+ΔZ and $p'_{ij}$=$p_{ij}$ mod 2$^s$, where ΔZ∈(0, 1, 2, 3) ands is the maximal possible integer such that 2$^s$≤Z.

The additional parameter ΔZ is selected based on the performance of the corresponding matrices in simulations (SNR needed to obtain BLER=10$^{-2}$) and can be done in offline for each $Z_{min}$. Thus, the storage required for the adaption parameters is no more than 2$Z_{max}$ bits for these parameters (two bits for each $Z_{min}$). Another example table of offset values and parameters for ΔZ is as follows:

TABLE 2

Example of offset value and parameters

| $Z_{min}$ | ΔZ (2 bit) | Automatically calculated parameters | | |
|---|---|---|---|---|
| | | Z = $Z_{min}$ + ΔZ | s | K |
| 7 | 1 | 8 | 3 | 97-112 |
| 8 | 1 | 9 | 3 | 113-128 |
| 9 | 1 | 10 | 3 | 129-144 |
| 10 | 1 | 11 | 3 | 145-160 |
| 11 | 1 | 12 | 3 | 161-176 |
| 12 | 1 | 13 | 3 | 177-192 |
| 13 | 3 | 16 | 4 | 193-208 |
| ... | ... | ... | ... | ... |
| 512 | 0 | 512 | 8 | 8177-8192 |

Once the lifted exponent matrix $(p'_{ij})_{m_b \times n_b}$ and the circulant size Z are obtained by the method described above, the code with codeword size $(n_b-2)Z$ and information block size $k_b Z$ can be obtained by puncturing the bits corresponding to the first two circulant columns. Parameters ΔK and ΔN can be defined as ΔK=$k_b$Z−K and ΔN=$(n_b-2)$Z−N−ΔK. If ΔN>0, ΔN redundant bits can further punctured starting from the end of the codeword. Once the puncturing described above has been applied and the punctured codeword obtained, if ΔK>0 further shortening can be done by zero padding for the first ΔK bits in the punctured codeword.

In accordance with an embodiment, a generalized lifting method is disclosed that provides an advanced version of offset-based lifting. One or more disclosed embodiments may provide for high performance for every information of length K with up to 1 bit granularity. Additionally, one or more embodiments provide for low hardware complexity where only 1 PCM is stored in memory. A simple hardware friendly based formula for obtaining a child matrix shifts from a mother matrix shifts is disclosed. In an embodiment, only one additional small table is needed for each size of Z. The table may be constructed offline by direct simulation. Furthermore, the table may be tuned for a specific decoder, range of rates, lengths, and number of iterations.

Figure 10:
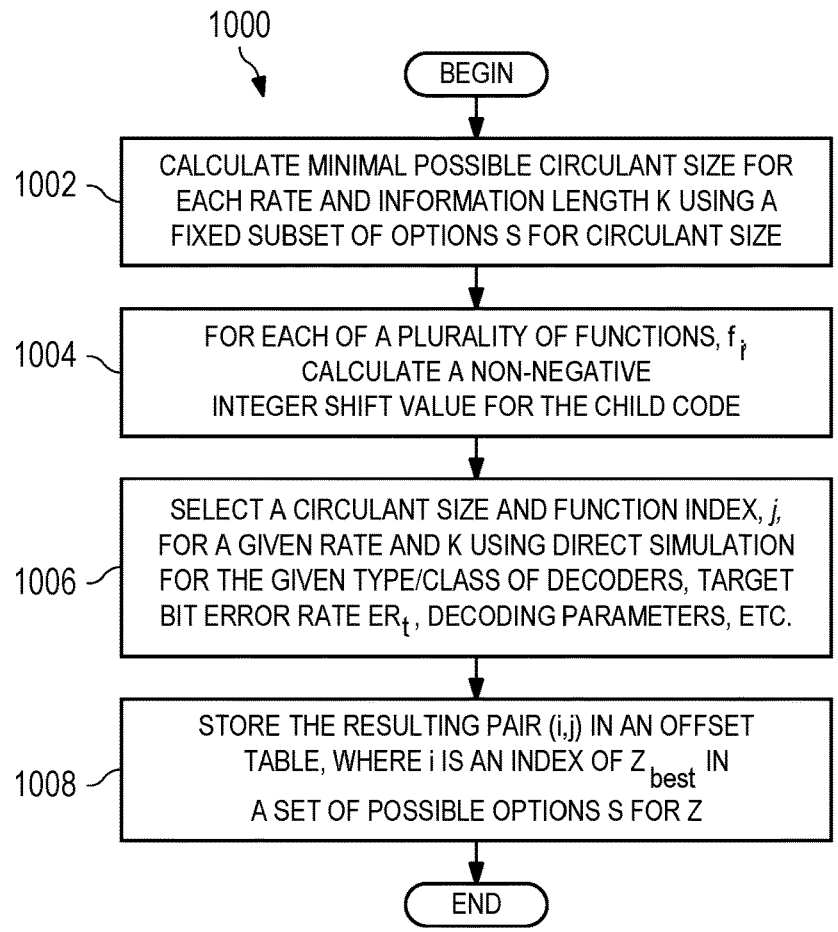
FIG. 10 is a flowchart of an embodiment of an offset lifting method for encoding data using a low density parity code.

FIG. 10 is a flowchart of an embodiment of an offset lifting method 1000 for encoding data using a low density parity code. For each rate and information length K, different options for circulant size, Z, are investigated. Thus, the method 1000 begins at block 1002 where a minimal circulant possible circulant size for each rate and information length, K, are calculated using a fixed subset of options S for circulant size. In an embodiment, the minimal possible circulant size is calculated as $Z_{orig}$=⌈K/Kb⌉ where K is a number of information bits and Kb is a number of information columns. S represents a fixed subset of options for circulant size Z≥$Z_{orig}$.

In an embodiment, S may be a predefined subset of the set $S_1$={$Z_{orig}$, $Z_{orig}$+1, . . . , $Z_{orig}$+d$Z_{max1}$}, where d$Z_{max1}$ is a positive integer. For example, d$Z_{max1}$=1 or d$Z_{max1}$=2 or d$Z_{max1}$=3.

In another embodiment, S may be a predefined subset of the set $S_2$={$2^{\lceil log2(Z_{orig}) \rceil}$, $2^{\lceil log2(Z_{orig}) \rceil}$+1, . . . , $2^{\lceil log2(Z_{orig}) \rceil}$+d$Z_{max2}$}, where d$Z_{max2}$ is a positive integer. For example: d$Z_{max2}$=1 or d$Z_{max2}$=2 or d$Z_{max2}$=3.

In some embodiments, set $S_2$ is preferable to set $S_1$ because $Z_{orig}$ may be very close but greater than some power of 2, but smaller and very far away from another power of 2. For example, $Z_{orig}$=129 is close to 128 and far from 256. Using set $S_1$, one would need to have quite a large value of d$Z_{max1}$ and a lot of simulations in order to explore Z=256. However, using set $S_2$, one can immediately "jump" to 256 and can use M=256 as a modulo.

In another embodiment, S may be a predefined subset of the set $S_3$={$2^{\lceil log2(Z_{orig}) \rceil}$, $2^{\lceil log2(Z_{orig}) \rceil +1}$, . . . , $2^{\lceil log2(Z_{orig}) \rceil +dZ_{max3}}$}, where d$Z_{max3}$ is a positive integer. For example: d$Z_{max3}$=1 or d$Z_{max3}$=2 or d$Z_{max3}$=3.

In another embodiment, a fixed subset of a union of the above sets $S_4$=$S_1 \cup S_2 \cup S_3$ may be considered. For example, e.g., Z may only have a form of n*2$^s$ where n is some positive integer and s is some non-negative integer. For example, in an embodiment, if n∈{3, 5, 7}, only the following values for Z are allowed for Z≤25: {1, 2, 3, 4, 5, 6, 8, 10, 12, 14, 16, 20, 24}. The allowed Z values are limited to those shown previously in this example since other numbers cannot be represented in a form {3, 5, 7}*2$^k$. For example, 25 is a number that cannot be represented as some number times 2$^k$. In this case, an embodiment lifting scheme may select from the predetermined subset $S_4$={Z∈$S_1 \cup S_2 \cup S_3$: Z≤$Z_{orig}$ & Z=n*2$^s$ for some n and s}. In an embodiment, for practical efficient implementation, first m (e.g., m=2, 4, 8) smallest allowed circulant sizes Z from the set (Z=n*2$^s$) may be considered. This implies at least two things. First, instead of looking at offsets such as 1, 2, 3, etc. which may provide "non-allowed" values for Z, the method iterates only through allowed values of Z which may save computational resources at the offset lifting table construction step. Second, in an embodiment, an index of allowed Zs is stored in the offset table rather than the absolute values of delta Z, thereby saving memory since fewer bits are required for storing indexes as opposed to absolute shifts.

For each rate and information length, K, and for each option of Z E S, a preset of functions $f_1, f_2, \ldots, f_n$ is investigated as follows. Thus, at block 1004, for each of the plurality of functions, $f_i$, a non-negative integer shift value is calculated for the child code according to the formula: $h_{child}{}^j$=$f_i(h_{mother}, Z)$, where $h_{mother}$ is a non-negative-one shift value of the mother code (for example, corresponding to the maximal information length $K_{max}$), and $h_{child}{}^j$ is a resulting shift value of the child code. After that, at block

1006, a circulant size, Z, and a function index, $i_2$, are selected and fixed for the given rate and K using direct simulation for the given type/class of decoders, target bit or block error rate $ER_t$, decoding parameters, etc. In embodiment, the circulant size, Z, and the function index, $i_2$, are selected according to the following formula:

$(Z_{best}, j_{best}) = \text{ArgMin}_{(Z \in s, j=1, \ldots, n)}(\text{SNR@}ER_t \text{ for the given } Z \text{ and } f_j)$ At block 1008, the resulting pair $(i_1, i_2)$ is stored in an offset table, T, where $i_1$ is an index of $Z_{best}$ in a set of possible options S for Z.

It should be noted that the simulation data is specific to the selected LDPC code. If a different LDPC code is utilized, then different simulation data is generated and used.

Figure 23:
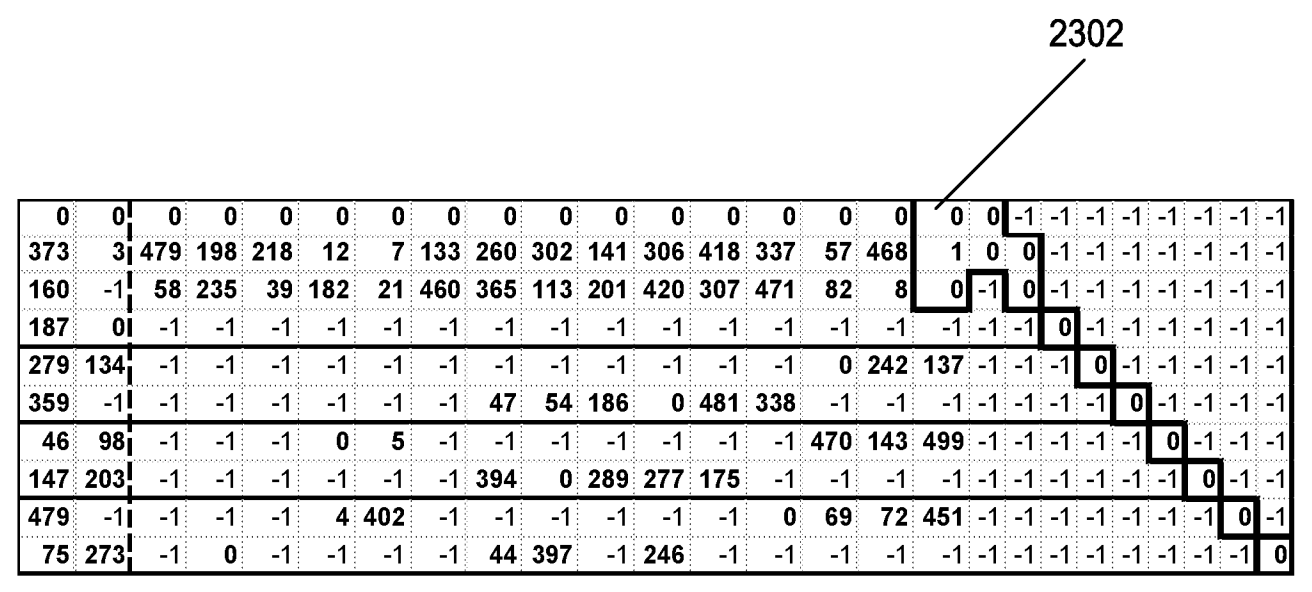

One should also note that some non-zero circulants of the mother code may be fixed so that the above described lifting scheme is not applied to them and their shift values are left unchanged. FIG. 23 shows an example of such fixed positions. In FIG. 23, the numbers that are enclosed with bold borders in an area 2302 are fixed circulants.

Thus, in an embodiment, offset table, T, contains the following entries shown in Table 4.

TABLE 4

| $Z_{orig} = \lceil K/K_b \rceil$ | $i_1 = 1, 2, \ldots, |S|$ | $i_2 = 1, 2, \ldots, n$ |
|---|---|---|
| $Z_{min}$ | 1 | 3 |
| ... | ... | ... |
| $Z_{max}$ | 2 | 4 |

Here, |S| denotes the size of set S.

Table 4 is an alternate embodiment of a lifting table as compared to table 2. Table 4 includes a column corresponding to $Z_{orig}$, a column representing with the index of $Z_{best}$ in a set of possible options S for Z, and a column providing the lifting function index. Table 4 is in contrast to table 2 in which the actual offsets are stored in the lifting table rather than indices. Furthermore, table 2 only uses a single lifting function. Therefore, there is no need for a lifting function index in table 2.

Another embodiment of a lifting table is provided in table 5 below.

TABLE 5

Example of offset value and parameters.

| | ΔZ index | Automatically calculated parameters | | | |
|---|---|---|---|---|---|
| $Z_{orig}$ | (3 bit value) | ΔZ | $Z = Z_{orig} + \Delta Z$ | s | K |
| 2 | 5 | 7 | 9 | 3 | 32 |
| 3 | 6 | 7 | 10 | 3 | 33-48 |
| 4 | 4 | 4 | 8 | 3 | 49-64 |
| 5 | 3 | 3 | 8 | 3 | 65-80 |
| 6 | 2 | 2 | 8 | 3 | 81-96 |
| 7 | 3 | 3 | 10 | 3 | 97-112 |
| 8 | 3 | 3 | 11 | 3 | 113-128 |
| ... | ... | ... | ... | ... | ... |
| 512 | 0 | 0 | 512 | 9 | 8177-8192 |

The lifting tables may store an index corresponding to an absolute value for ΔZ (i.e., the circulant size offset) or may store the actual values for ΔZ. In some embodiments, it may be beneficial to store the index rather than the actual ΔZ to save memory.

It should be noted that blocks 304, 306, and 308 in method 300 shown in FIG. 3 may be performed for each coding rate independently. In such case, each given rate, R, will have a separate table, $T_R$.

In another embodiment, table T may be selected as a result of direct simulations for all rates and, therefore, will not depend on rate. For example, the following cost functions may be used for this purpose:

$(Z_{best}, i_{2_{best}}) = \text{ArgMin}_{(Z \in s, i_2 = 1, \ldots, n)}(\text{sum}_R\{\text{SNR@}\{R, ER_t\} \text{ for the given } Z \text{ and } f_{i_2}\})$ $(Z_{best}, i_{2_{best}}) = \text{ArgMin}_{(Z \in s, i_2 = 1, \ldots, n)}(\text{max}_R\{\text{SNRloss@}\{R, ER_t\} \text{ for given } Z \text{ and } f_{i_2}\})$ Here, SNR@{R,ERt} denotes an SNR threshold in order to reach the target error rate ERt for the given rate R, and SNRloss means such SNR threshold difference with some other (reference) solution. In an embodiment, $\text{sum}_R$ is a weighted sum since some rates may be more important than others. In an embodiment, $\text{max}_R$ may be replaced by a sum or a weighted sum. The threshold difference may be in a form max(0, SNR—SNRreference) because in an embodiment negative loss is considered as 0 (i.e., no) loss. Thus, in an embodiment, only the positive loss is minimized.

Method 300 describes the most general case of the offset lifting method. In a practical implementation, functions $f_1$, $f_2$, ..., $f_n$ may be selected to be hardware implementation friendly. Example embodiments that describe such functions are the following.

It should be noted that both the encoder and the decoder generate a child PCM from the mother PCM by changing the mother shift table (typically stored in an interleaved way which is called "decoding schedule"). This is done using an offset lifting table as shown above and a lifting formula.

Example A

Let mother code shift values be limited by a maximal circulant size $Z_{max}$: $h_{mother} < Z_{max}$. Let k is a number of bits sufficient to store mother shift values, i.e. $k = \lceil \log_2(Z_{max}) \rceil$. Let Z is a circulant size for the child code defined according to the above explained Step 1 and s is a number of bits which is sufficient to store shift values for the child code, i.e. $s = \lceil \log_2(Z) \rceil$. Then functions $f_1, f_2, \ldots, f_n$ may be defined as numbers obtained by selecting all or some fixed s bits from k bits of the mother shift value. For example, let $Z_{max} = 32$ and $Z = 16$. In this case $k = \log_2(32) = 5$ and $s = \log_2(16) = 4$. Then, example A provides the following n=5 functions (or a subset of this set):

$h_{mother} = b_4 b_3 b_2 b_1 b_0$ $f_1(h_{mother}, 16) = b_3 b_2 b_1 b_0$ $f_2(h_{mother}, 16) = b_4 b_2 b_1 b_0$ $f_3(h_{mother}, 16) = b_4 b_3 b_1 b_0$ $f_4(h_{mother}, 16) = b_4 b_3 b_2 b_0$ $f_5(h_{mother}, 16) = b_4 b_3 b_2 b_1$ One should note that from hardware implementation point of view, scheme A is very simple as it just needs extraction of the given set of s bits from a bigger number of k bits stored in memory or on registers.

Example B

Example lifting scheme B is a generalization of Example lifting scheme A. Let mother code shift values are again limited by a maximal circulant size $Z_{max}$: $h_{mother} < Z_{max}$ and k is a number of bits sufficient to store mother shift values, i.e. $k = \lceil \log_2(Z_{max}) \rceil$. Let Z be a circulant size for the child code and $s = \lceil \log_2(Z) \rceil$. Then each function $f_1, f_2, \ldots, f_n$ may be defined using the following sub-steps:

(1) Select some $s_1 <= k$ bits at fixed positions $p_1^{(1)}, p_2^{(1)}, \ldots p_{s1}^{(1)}$ (2) Select some $s_2 <= k$ bits at fixed positions $p_1^{(2)}, p_2^{(2)}, \ldots p_{s2}^{(2)}$

...

(r) Select some $s_r <= k$ bits at fixed positions $p_1^{(r)}, p_2^{(r)}, \ldots p_{sr}^{(r)}$ (r+1) Sum up the integers obtained at steps (1)-(r)

(r+2) Optionally, select some $s$ bits from the sum in (r+1)

For example, let again $Z_{max}=32$ and $Z=16$. In this case $k=\log_2(32)=5$ and $s=\log_2(16)=4$. Then, in this example for scheme B the following functions may be used as $f_1$ and $f_2$:

$$h_{mother} = b_4 b_3 b_2 b_1 b_o$$

$$f_1(h_{mother}, 16) = b_4 b_3 b_2 + b_4 b_3 b_2 b_1$$

$$f_2(h_{mother}, 16) = b_4 b_3 + b_4 b_3 b_2$$

It is easily observed that $f_1$ and $f_2$ implement the following functions: $f_1(h,16)=\lfloor 3*h/4 \rfloor$ and $f_2(h,16)=\lfloor 3*h/8 \rfloor$. One should note that from hardware implementation point of view, scheme B is also very simple as it needs several extractions of the given set of bits from a larger number of k bits stored in memory or on registers, and then summing up these numbers.

Example C

Example lifting scheme C is a narrow variant of Example lifting scheme A. Let mother code shift values are limited by $h_{mother} < Z_{max}$ and k is a number of bits sufficient to store mother shift values, i.e. $k=\lceil \log_2(Z_{max}) \rceil$. Let Z be a circulant size for the child code and $s=\lceil \log_2(Z) \rceil$. Then each function $f_1, f_2, \ldots, f_n$ may be defined as taking s (or less) adjacent bits from the mother shift, i.e. if $h_{mother}=b_{k-1} b_{k-2} \ldots b_1 b_0$, then:

$$f_1(h_{mother}, Z) = b_{k-1} b_{k-2} \ldots b_{k-s},$$

$$f_2(h_{mother}, Z) = b_{k-2} b_{k-3} \ldots b_{k-s-1},$$

...

$$f_{k-s+2}(h_{mother}, Z) = b_{s-2} b_{s-2} \ldots b_o,$$

or a subset of this set.

One should note that each $f_i(h_{mother}, Z)=b_{k-1} b_{k-i-1} \ldots b_{k-s-i+1}$, actually calculates the following function: $f_i(h_{mother}, Z)=\lfloor h_{mother}/2^{k-s-i+1} \rfloor \mod 2^s$.

Example D

Example lifting scheme D is a special case of Example lifting scheme C.

Let mother code shift values are limited by $h_{mother} < Z_{max}$ and k is a number of bits sufficient to store mother shift values, i.e. $k=\lceil \log_2(Z_{max}) \rceil$. Let Z be a circulant size for the child code and $s=\lceil \log_2(Z) \rceil$. Then each function $f_1, f_2, \ldots, f_n$ may be defined as taking s or smaller number of least significant bits from the mother shift, i.e. if $h_{mother}=b_{k-1}, b_{k-2} \ldots b_1 b_0$, then:

$$f_1(h_{mother}, Z) = b_{s-1} b_{s-2} \ldots b_o,$$

$$f_2(h_{mother}, Z) = b_{s-2} b_{s-3} \ldots b_o,$$

...

$$f_s(h_{mother}, Z) = b_o,$$

or a subset of this set.

One should note that each $f_i(h_{mother}, Z)$ actually calculates the modulo of the mother offset over a power of 2: $f_i(h_{mother}, Z)=h_{mother} \mod 2^i$.

Example E

Example lifting scheme E is a special case of Example lifting scheme C. Let mother code shift values are limited by $h_{mother} < Z_{max}$ and k is a number of bits sufficient to store mother shift values, i.e. $k=\lceil \log_2(Z_{max}) \rceil$. Let Z be a circulant size for the child code and $s=\lceil \log_2(Z) \rceil$. Then each function $f_1, f_2, \ldots, f_n$ may be defined as taking s or smaller number of most significant bits from the mother shift, i.e. if $h_{mother}=b_{k-1}, b_{k-2} \ldots b_1 b_0$, then:

$$f_1(h_{mother}, Z) = b_{k-1} b_{k-2} \ldots b_{k-s},$$

$$f_2(h_{mother}, Z) = b_{k-1} b_{k-2} \ldots b_{k-s+1},$$

...

$$f_s(h_{mother}, Z) = b_{k-1},$$

or a subset of this set.

One should note that each $f_i(h_{mother}, Z)$ actually calculates the floor of the mother offset over a power of 2: $f_i(h_{mother}, Z)=\lfloor h_{mother}/2^{k-s+i-1} \rfloor$.

Example F

Let again $s=\lceil \log_2(Z) \rceil$. The following lifting function f may be used:

$$f(h_{mother}, z) = \begin{cases} h_{mother} \mod 2^{s-1}, & \text{if } (h_{mother} \mod 2^s) \geq z, \\ h_{mother} \mod 2^s, & \text{if } (h_{mother} \mod 2^s) < z \end{cases}$$

In the above formula mod is just an example of a bit operation, any other above listed functions $f_i$ may be used instead.

Encoding for LDPC Matrix with Lower-Triangular Extension

Figure 11:
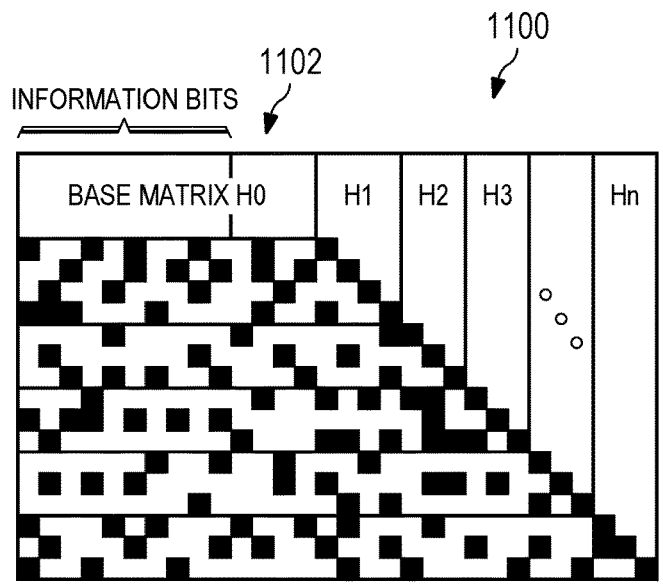
FIG. 11 is a diagram of an embodiment of a base matrix matrix $H_0$ for an encoding procedure for LDPC matrix with lower-triangular extension.

Following is a description of an embodiment of an encoding procedure for LDPC matrix with lower-triangular extension shown on FIG. 11 of the base matrix $H_0$ 1102. For other types of matrices a similar approach can be used. First of all the lifting method is applied and for each circulant the corresponding shift value is calculated.

Submatrices ($H_0, H_1, H_2, \ldots$) of this parity-check matrix can be used to construct LDPC codes of different rates. The base matrix 1102 has the highest rate of all codes from family. For each parity-check matrix $H_i$ of family it contains a lower triangular extension 1200 as shown in FIG. 12 such that all matrices $H_j$, $j<i$ of rates higher than H as shown in FIG. 11. Because of lower-triangular structure, additional parity bits for code $C_{i+1}$ can be easily calculated from codeword of $C_j$. If we have codeword $w_i \in C_i$ (i.e. $H_i w_i = 0$), and matrix $H_i$ has lower-triangular extension $$H_{i+1} = \begin{bmatrix} H_i & 0 \\ L & L_p \end{bmatrix}$$

1200 as shown in FIG. 12, then additional bits w' can be calculated from equation $L_p w' + Lw = 0$. Matrix L is sparse and $L_p$ is sparse and lower-triangular. So, first we need to calculate $s = Lw$ by multiplication w by sparse matrix L, then we need to solve linear system $L_p w' = s$ with lower-triangular sparse matrix $L_p$. Both operations may be done efficiently. Total complexity of calculation of w' is proportional to total number of non-zero elements of matrix $[L\ L_p]$. The most used type of lower-triangular extension is raptor-like extension for which $L_p = I$.

FIG. 13 is a diagram showing an embodiment of an IRA LDPC parity-check matrix structure 1300. In an aspect, the base matrix $H_0$ has the dual-diagonal structure (also called IRA structure) in section 1306. Efficient encoding for this matrix is possible working directly on its parity-check matrix, due to its particular IRA structure shown in FIG. 13.

In the table 1400 depicted in FIG. 14, one can see an example of a QC matrix with IRA structure. It is the exponent matrix of the IEEE802.16-2009 LDPC code with codeword length n=2304, R=1/2 and the circulant size 96.

In an aspect, one can describe an efficient encoding method for IRA QC LDPC codes. Suppose that this matrix is specified by its c×t exponent matrix with circulant size b such as shown above. Note that in such a matrix the column of index $t-c=k/b$ of all exponent matrices, i.e., the column associated with coded bits $x_{(t-c)b} = p_0, \ldots, x_{(t-c+1)b-1} = p_{b-1}$, has exactly three non-negative elements, two of which are identical and one being unpaired. Next, the row index of this unpaired element is denoted by C. Encoding may then be efficiently performed as follows.

Let the vector containing the information symbols be $u = [u_0, u_1, \ldots, u_{t-c-1}]$, where for $0 \leq j \leq t-c-1$ vector $u_j$ contains the b information bits associated with the j th column of the exponent matrix, i.e., $u_j = [u_{jb}, \ldots, u_{(j+1)b-1}]$. Similarly, let the vector containing the parity bits be $p = [p_0, \ldots, p_{c-1}]$, where for $0 \leq i \leq c-1$ vector $p_i$ contains the b parity bits associated with the (t-c+i)th column of the exponent matrix, i.e., $p_i = [p_{ib}, \ldots, p_{(i+1)b-1}]$.

The b parity bits forming $p_0$ are computed based on the b parity-check equations corresponding to the row of the exponent matrix including the unpaired non-negative element of its (t-c)th column. In fact, letting $P_{i,j}$ be the square b×b matrix representing the expansion of element (i,j) in the exponent matrix, summing over all the parity-check equations yields $$P_{\xi,t-c} p_0 = \sum_{i=0}^{c-1} \sum_{j=0}^{t-c-1} P_{i,j} u_j$$

and therefore $$p_0 = (P_{\xi,t-c})^{-1} \Sigma_{i=0}^{c-1} \Sigma_{j=0}^{t-c-1} P_{i,j} u_j.$$

Note that multiplication by each $P_{i,j}$ as well as by $(P_{\xi,t-c})^{-1}$ simply represents a cyclic shift (the inverse of a circulant permutation matrix is itself a circulant permutation matrix). Once the elements of vector $p_0$ are known, for i=0, ..., c−2 the elements of vector $p_{i+1}$ may be calculated as $p_{i+1} = P_{i+1,t-c} p_0 + p_i + \Sigma_{j=0}^{t-c-1} P_{i+1,j} u_j$, where again all multiplications may be efficiently implemented as cyclic shifts, and where in the summation the term $p_i$ is not present if i=0.

Figure 15:
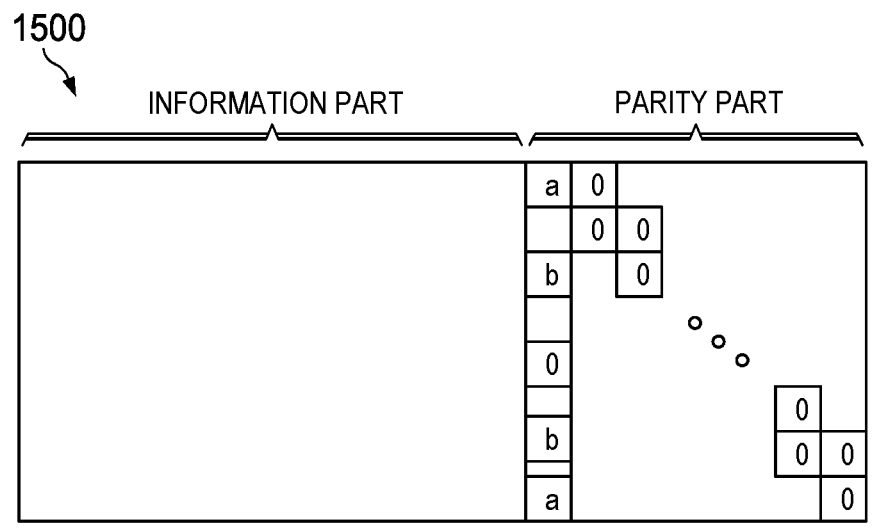
FIG. 15 is a diagram showing an embodiment of a matrix with an IRA structure which can be used with the disclosed encoding procedures.

It is easy to see that the described above scheme can be also used for matrices with similar to IRA structure. For example for the matrix 1500 shown in FIG. 15, one can also use a similar encoding method.

Figure 16:
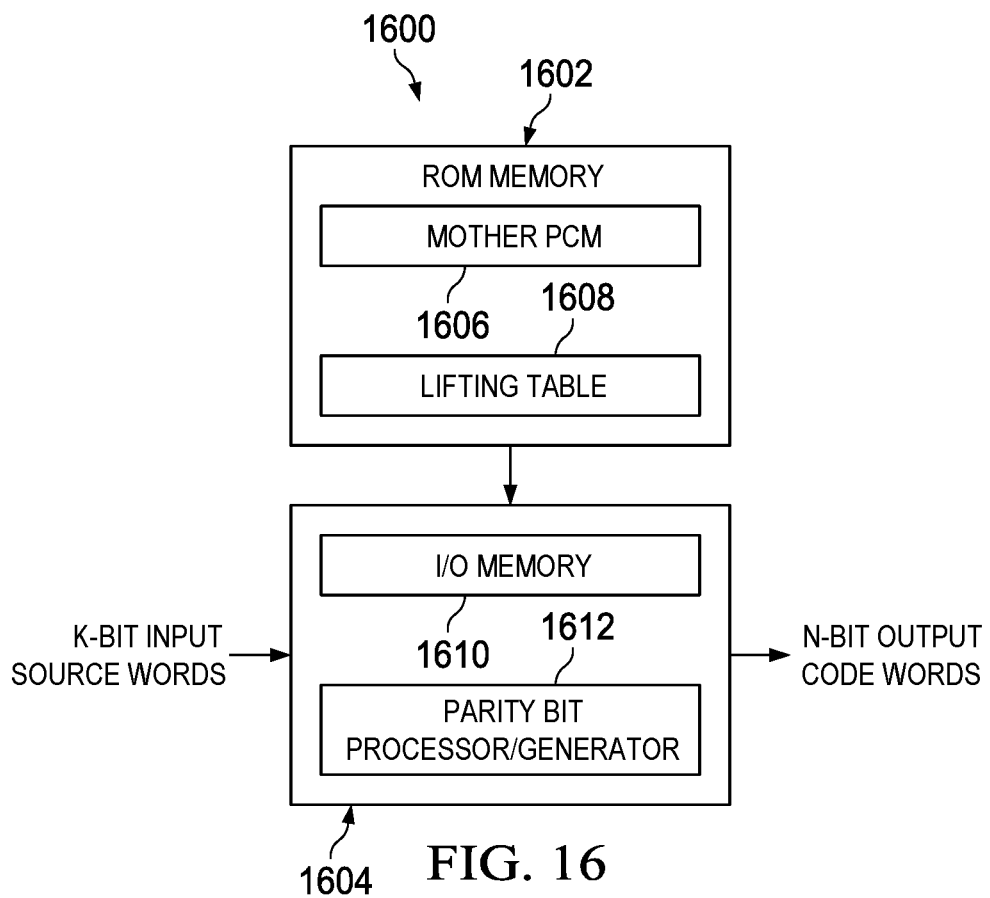
FIG. 16 is a block diagram of an embodiment of a LDPC encoder.

FIG. 16 is a block diagram of an embodiment of a LPDC encoder 1600. LPDC encoder 1600 includes read-only memory 1602 where a mother PCM 1606 and a lifting table 1608 are stored. The LPDC encoder 1600 also includes an encoder component 1604 that includes I/O memory 1610 and a parity bit processor/generator 1612. The encoder 1600 receives a K-bit input source word and generates an N-bit output code word. The I/O memory 1610 stores the input K-bit information word and is used by the encoder 1604 to generate the K-bit output. The read-only memory 1602 stores mother code circulant shift values stored in the mother PCM 1606 and the lifting table 1608. In an embodiment, the lifting functions are implemented in hardware and are not stored in memory. The lifting table 1608 includes indices of circulant size offsets and/or indices corresponding to the allowed circulant sizes and indices corresponding to a lifting function to be used. The parity bit processor/generator 1612 generates an N-bit output code word according to the K-bit input using appropriate LDPC encoding method, using the child PCM generated on the fly from the mother PCM 1606 (or a generator matrix corresponding to this child PCM). This child PCM generation is done by producing offset values of the child code, for each non-zero circulant of the mother PCM 1606, by selecting one of the circulant size offset values and/or allowed circulant size, and using this circulant offset and one of the lifting functions or a set of functions corresponding to selected indices in the lifting table that are appropriate for the given size, K, of the input. The N-bit output is then stored in the I/O memory 1610.

FIG. 17 is a block diagram of an embodiment of a LPDC decoder 1700. The LPDC decoder 1700 includes a read-only memory 1702 for storing mother PCM 1706 and the lifting table 1708, and a decoder component 1704 that includes I/O memory 1710 and a check node processor 1712. The decoder 170000 receives an input LLR (log likelihood ratio) sequence of length N and generates a K-bit output. The read-only memory 1702 stores circulant shift values of the mother PCM 1706 and the lifting table 1708. The lifting table 1708 includes indices of circulant size offsets and/or allowed circulant sizes, and indices corresponding to a lifting function. The I/O memory 1710 stores the input vector of length N of LLR values and is used by the check node processor 1712 to generate the K-bit output. The K-bit output is then stored in the I/O memory 1710. The check node processor 1712 generates a K-bit output information bit sequence according to the received N-component input, using a child PCM generated on the fly from the mother PCM 1706 by producing, for each non-zero circulant of the mother PCM 1706, shift values of the child code from the mother code shift value by selecting one of the circulant offset values and/or allowed circulant size and applying to it a lifting function or functions corresponding to selected indices in the lifting table 1708.

FIG. 18 is a flowchart of an embodiment of a method 1800 for encoding data using LDPC, the disclosed lifting tables, and the disclosed lifting functions. The method 1800 includes receiving a K-bit source word. The K-bit source word is encoded by an LPDC coder to produce an N-bit code word using the disclosed lifting table and lifting functions. The encoder then transmits the N-bit code word. It should be noted that LDPC codes having a parity-check matrix $H_{r \times n}$ of a particular structure such as, for example, a parity-check matrix $H_{r \times n}$ having a parity part of dual diagonal structure allows the encoding of the information sequence $IS_1$ using (only) the parity-check matrix $H_{r \times n}$ so that obtaining the generator matrix $G_{k \times n}$ may not be required (cf. T. J. Richardson and R. L. Urbanke, "*Efficient encoding of low-density parity-check codes*", IEEE TRANSACTIONS ON INFORMATION THEORY, Volume 47, Issue 2, Pages 638-656, August 2002, the contents of which are incorporated herein by reference as if reproduced in its entirety).

FIG. 19 is a flowchart of an embodiment of a method 1900 for decoding data using LDPC, the disclosed lifting tables, and the disclosed lifting functions. The method 1900 includes receiving a K-bit source word. The N-bit code word is decoded by an LPDC coder to produce an K-bit source word using the disclosed lifting table and lifting functions. The decoder then stores the K-bit source word. The decoder uses the redundancy in the received information sequence in a decoding operation performed by the decoder to correct errors in the received information sequence and produce a decoded information sequence (cf. M. P. C. Fossorier et al., "Reduced Complexity Iterative Decoding of Low-Density Parity Check Codes Based on Belief Propagation", IEEE TRANSACTIONS ON COMMUNICATIONS, May 1999, Volume 47, Number 5, Pages 673-680, and J. Chen et al., "Improved min-sum decoding algorithms for irregular LDPC codes", PROCEEDINGS OF THE 2005 IEEE INTERNATIONAL SYMPOSIUM ON INFORMATION THEORY, Pages 449-453, September 2005). The decoded information sequence is an estimate of the encoded information sequence from which (an estimate of) the information sequence can be extracted.

Figure 20:
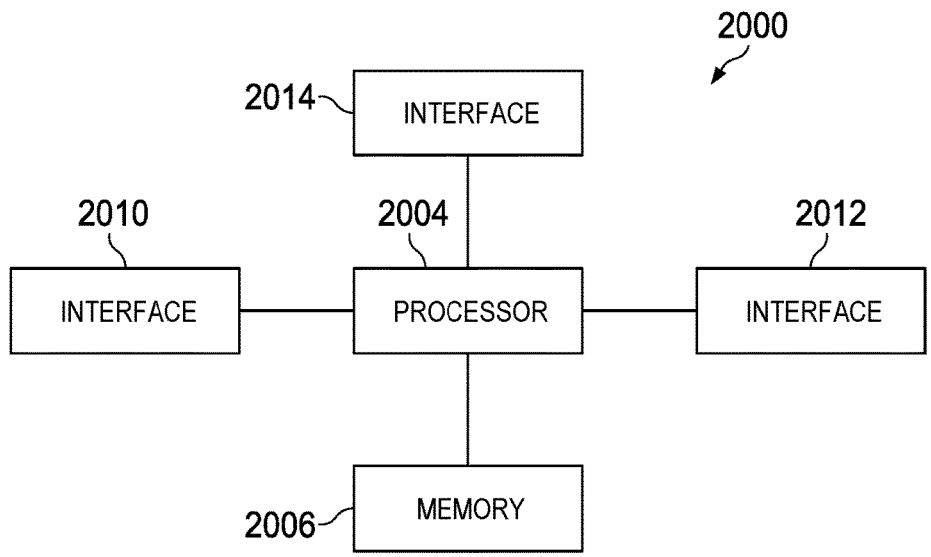
FIG. 20 illustrates a block diagram of an embodiment processing system for performing methods described herein, which may be installed in a host device.

FIG. 20 illustrates a block diagram of an embodiment processing system 2000 for performing methods described herein, which may be installed in a host device. As shown, the processing system 2000 includes a processor 2004, a memory 2006, and interfaces 2010-2014, which may (or may not) be arranged as shown in FIG. 20. The processor 2004 may be any component or collection of components adapted to perform computations and/or other processing related tasks, and the memory 2006 may be any component or collection of components adapted to store programming and/or instructions for execution by the processor 2004. In an embodiment, the memory 2006 includes a non-transitory computer readable medium. The interfaces 2010, 2012, 2014 may be any component or collection of components that allow the processing system 2000 to communicate with other devices/components and/or a user. For example, one or more of the interfaces 2010, 2012, 2014 may be adapted to communicate data, control, or management messages from the processor 2004 to applications installed on the host device and/or a remote device. As another example, one or more of the interfaces 2010, 2012, 2014 may be adapted to allow a user or user device (e.g., personal computer (PC), etc.) to interact/communicate with the processing system 2000. The processing system 2000 may include additional components not depicted in FIG. 20, such as long term storage (e.g., non-volatile memory, etc.).

In some embodiments, the processing system 2000 is included in a network device that is accessing, or part otherwise of, a telecommunications network. In one example, the processing system 2000 is in a network-side device in a wireless or wireline telecommunications network, such as a base station, a relay station, a scheduler, a controller, a gateway, a router, an applications server, or any other device in the telecommunications network. In other embodiments, the processing system 2000 is in a user-side device accessing a wireless or wireline telecommunications network, such as a mobile station, a user equipment (UE), a personal computer (PC), a tablet, a wearable communications device (e.g., a smartwatch, etc.), or any other device adapted to access a telecommunications network.

In some embodiments, one or more of the interfaces 2010, 2012, 2014 connects the processing system 2000 to a transceiver adapted to transmit and receive signaling over the telecommunications network.

Figure 21:
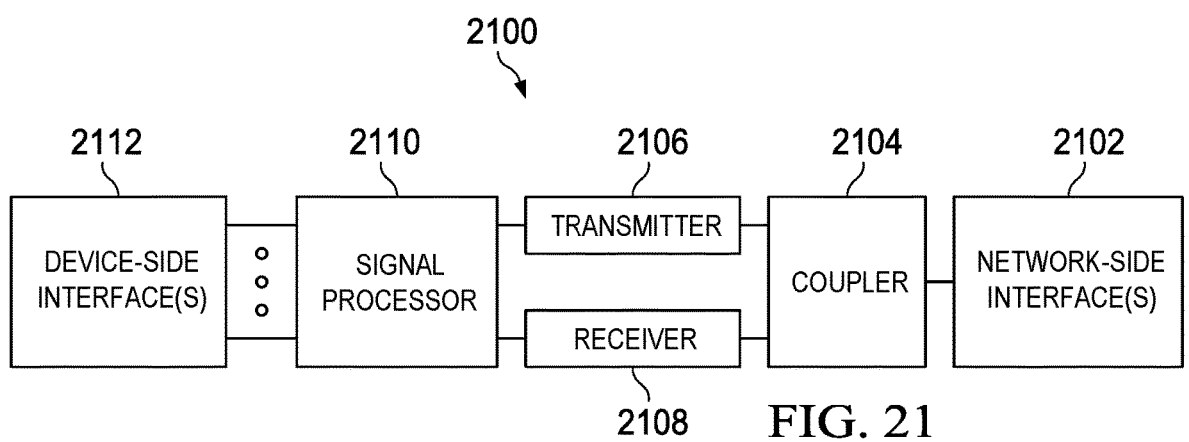
FIG. 21 illustrates a block diagram of a transceiver adapted to transmit and receive signaling over a telecommunications network.

FIG. 21 illustrates a block diagram of a transceiver 2100 adapted to transmit and receive signaling over a telecommunications network. The transceiver 2100 may be installed in a host device. As shown, the transceiver 2100 includes a network-side interface 2102, a coupler 2104, a transmitter 2106, a receiver 2108, a signal processor 2110, and a device-side interface 2112. The network-side interface 2102 may include any component or collection of components adapted to transmit or receive signaling over a wireless or wireline telecommunications network. The coupler 2104 may include any component or collection of components adapted to facilitate bi-directional communication over the network-side interface 2102. The transmitter 2106 may include any component or collection of components (e.g., up-converter, power amplifier, etc.) adapted to convert a baseband signal into a modulated carrier signal suitable for transmission over the network-side interface 2102. The receiver 2108 may include any component or collection of components (e.g., down-converter, low noise amplifier, etc.) adapted to convert a carrier signal received over the network-side interface 2102 into a baseband signal. The signal processor 2110 may include any component or collection of components adapted to convert a baseband signal into a data signal suitable for communication over the device-side interface(s) 2112, or vice-versa. The device-side interface(s) 2112 may include any component or collection of components adapted to communicate data-signals between the signal processor 2110 and components within the host device (e.g., the processing system 2000, local area network (LAN) ports, etc.).

The transceiver 2100 may transmit and receive signaling over any type of communications medium. In some embodiments, the transceiver 2100 transmits and receives signaling over a wireless medium. For example, the transceiver 2100 may be a wireless transceiver adapted to communicate in accordance with a wireless telecommunications protocol, such as a cellular protocol (e.g., long-term evolution (LTE), etc.), a wireless local area network (WLAN) protocol (e.g., Wi-Fi, etc.), or any other type of wireless protocol (e.g., Bluetooth, near field communication (NFC), etc.). In such embodiments, the network-side interface 2102 includes one or more antenna/radiating elements. For example, the network-side interface 2102 may include a single antenna, multiple separate antennas, or a multi-antenna array configured for multi-layer communication, e.g., single input multiple output (SIMO), multiple input single output (MISO), multiple input multiple output (MIMO), etc. In other embodiments, the transceiver 2100 transmits and receives signaling over a wireline medium, e.g., twisted-pair cable, coaxial cable, optical fiber, etc. Specific processing systems and/or transceivers may utilize all of the components shown, or only a subset of the components, and levels of integration may vary from device to device.

Figure 22:
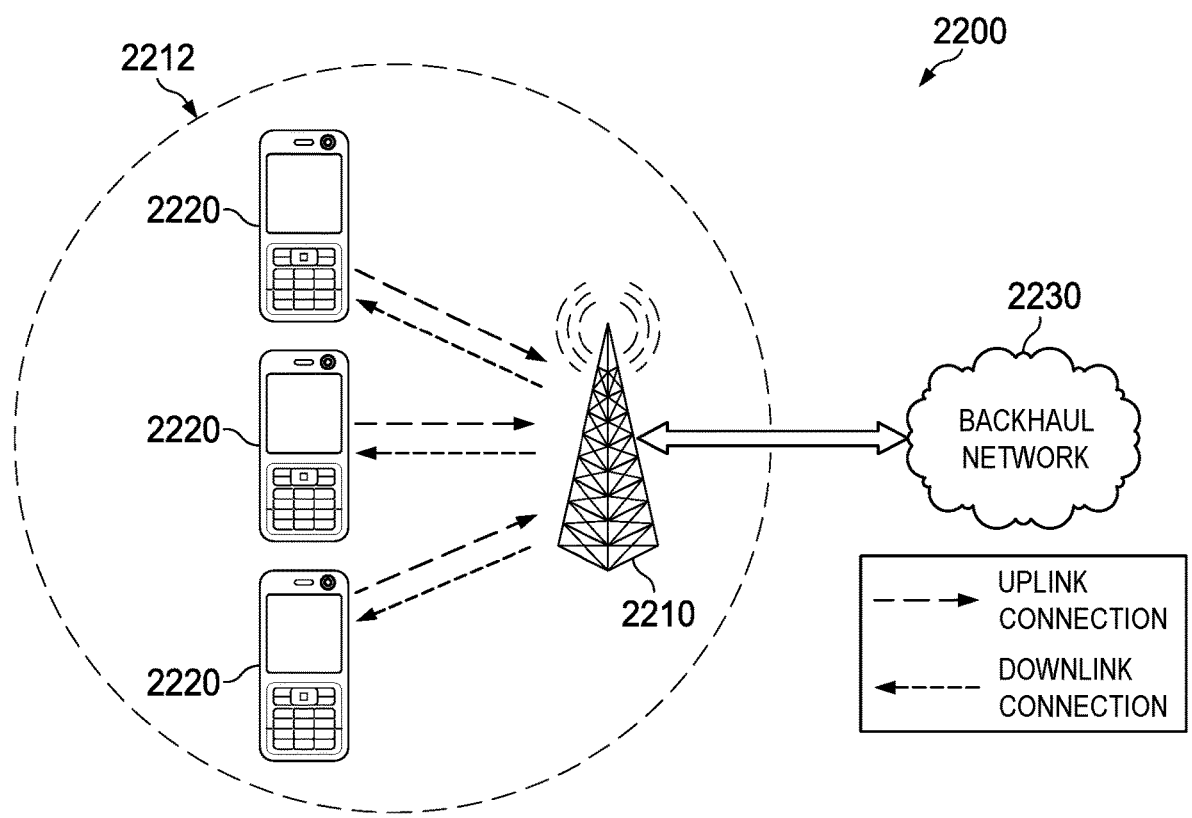
FIG. 22 illustrates an embodiment network for communicating data in which the disclosed methods and systems may be implemented.

FIG. 22 illustrates an embodiment network 2200 for communicating data in which the disclosed methods and systems may be implemented. The network 2200 includes a plurality of network components. The network components may include an access point (AP), a station (STA) (e.g., a wireless device or user equipment (UE) such as a wireless phone, etc.), or any other wireless reception point. In an embodiment, the network 2200 includes an access point (AP) 2210 having a coverage area 2212, a plurality of STAs 2220, and a backhaul network 2230. In an embodiment, the AP may be implemented as transceiver 2100 shown in FIG. 21. In an embodiment, the STAs 2220 may be implemented as, for example, processing system 2000 shown in FIG. 20. As used herein, the term AP may also be referred to as a transmission point (TP) and the two terms may be used interchangeably throughout this disclosure. In various embodiments, the AP 2210 may be a base station (BS) also referred to as a base transceiver station (BTS). Examples of a BS include an e Node B (eNB), a gNB, and the like. In an embodiment, the AP 2210 may be a wireless router. Thus, the AP 2210 may include any component capable of providing wireless access by, inter alia, establishing uplink (dashed line) and/or downlink (dotted line) connections with the STAs 2220. The STAs 2220 may include any component capable of establishing a wireless connection with the AP 2210. Examples of STAs 2220 include mobile phones, tablet computers, and laptop computers. The backhaul network 2230 may be any component or collection of components that allow data to be exchanged between the AP 2210 and a remote end (not shown). In some embodiments, the network 2200 may include various other wireless devices, such as relays, femtocells, etc.

It should be appreciated that one or more steps of the embodiment methods provided herein may be performed by corresponding units or modules. For example, a signal may be transmitted by a transmitting unit or a transmitting module. A signal may be received by a receiving unit or a receiving module. A signal may be processed by a processing unit or a processing module. Other steps may be performed by an iterating unit/module, a difference unit/module, an adjustment unit/module, a generating unit/module, a calculating unit/module, an assigning unit/module, an incrementing unit/module, a decrementing unit/module, and/or a setting unit/module. The respective units/modules may be hardware, software, or a combination thereof. For instance, one or more of the units/modules may be an integrated circuit, such as field programmable gate arrays (FPGAs) or application-specific integrated circuits (ASICs).

In an embodiment, a method for lifting a child code from one or more mother codes for encoding data includes calculating a plurality of shifts for a child code using a fixed set of a plurality of lifting functions and a fixed set of allowed circulant size offsets and/or circulant sizes. The method also includes determining a combination of circulant size and lifting function according to a direct simulation, an information length, a code rate, and a decoder. The method also includes storing a circulant size offset and/or circulant size index and a lifting function index corresponding to the determined combination of circulant offset and/or size and lifting function in a lifting table. The circulant offset and/or size index and the lifting function index are used to encode and decode data.

In an embodiment, a network component configured for decoding data includes a processor and a computer readable storage medium storing programming for execution by the processor. The programming includes instructions for calculating a plurality of shifts for a child code using a fixed set of a plurality of lifting functions and a fixed set of allowed circulant sizes. The programming also includes instructions for determining a combination of circulant size and lifting function according to a direct simulation, an information length, a code rate, and a decoder. The programming also includes instructions for storing a circulant size index and a lifting function index corresponding to the determined combination of circulant size and lifting function in a lifting table, the circulant size index and the lifting function index used to encode and decode data.

In an embodiment, a non-transitory computer-readable medium storing computer instructions for decoding data, that when executed by one or more processors, cause the one or more processors to perform a plurality of steps. The steps include calculating a plurality of shifts for a child code using a fixed set of a plurality of lifting functions and a fixed set of allowed circulant sizes. The steps also include determining a combination of circulant size and lifting function according to a direct simulation, an information length, a code rate, and a decoder. The steps also include storing a circulant size index and a lifting function index corresponding to the determined combination of circulant size and lifting function in a lifting table, the circulant size index and the lifting function index used to encode and decode data.

In an embodiment, a network component includes a read only memory comprising at least a parity portion of a mother PCM and a lifting table. The network component also includes a parity bit generator configured to generate parity bits from a source word according to a child code. The child code is determined from the lifting table and the at least a parity portion of the mother PCM. The lifting table includes a combination of circulant size and lifting function according to an information length, a code rate, and a decoder.

In an embodiment, a network component includes a read only memory comprising at least a parity portion of a mother PCM and a lifting table. The network component also includes an input/output memory. The network component also includes a check node processor configured to receive a N-bit code word and determine a K-bit source word according to a child code and store the k=bit source word in the input/output memory. The child code is determined from the lifting table and the at least a parity portion of the mother PCM. The lifting table includes a combination of circulant size and lifting function according to an information length, a code rate, and a decoder.

In an embodiment, a method for encoding data includes receiving a K-bit source word input. The method also includes encoding the K-bit source word input according to a LDPC code, a lifting function, and a circulant size offset to generate an N-bit code word output. The circulant size and lifting function are determined according to an information length, a code rate, and a decoder. The method also includes storing the N-bit code word output in input/output memory.

In an embodiment, a method for decoding data includes receiving an N-bit code word input. The method also includes decoding the N-bit code word input according to a LDPC code, a lifting function, and a circulant size offset to generate an K-bit source word output. The circulant size and lifting function are determined according to an information length, a code rate, and a decoder. The method also includes storing the K-bit source word output in input/output memory.

In any of the preceding aspects, the parity bit generator is further configured to receive a K-bit source word and determine an N-bit code word according to the mother PCM and the lifting table.

In any of the preceding aspects, shifts of non-zero circulants for predefined positions are unchanged.

In any of the preceding aspects, the lifting table is shared by at least some the one or more mother codes obtained by puncturing parity bits to change the rate of the code.

In any of the preceding aspects, the lifting functions for defining child shifts from the mother shift are defined as selecting the given number of bits from the binary representation of the mother shift at some predefined positions.

In any of the preceding aspects, the lifting functions for defining child shifts from the mother shift are defined by selecting the given number of bits from the binary representation of the mother shift at some predefined positions; and selecting the given number of bits from the binary representation of the mother shift at some other predefined positions.

In any of the preceding aspects, the method further includes repeating the selecting the given number of bits from the binary representation of the mother shift at some other predefined positions several times.

In any of the preceding aspects, each iteration of the selecting the given number of bits from the binary representation of the mother shift at some other predefined positions several times comprises a substep and further comprising summing results of each such substep.

In any of the preceding aspects, the method also includes selecting the given number of bits from the binary representation of the result of the summing at some other predefined positions.

In any of the preceding aspects, the lifting functions for defining child shifts from the mother shift select a fixed number of adjacent bits from a binary representation of the mother shift value.

In any of the preceding aspects, the lifting functions for defining child shifts from the mother shift select the fixed number of most significant bits from the binary representation of the mother shift value.

In any of the preceding aspects, the lifting functions for defining child shifts from the mother shift select the fixed number of least significant bits from the binary representation of the mother shift value.

In any of the preceding aspects, the lifting function firstly selects s bits from the mother shift value at the predefined s bit positions, wherein s corresponds to the minimal power of 2 greater than equal to circulant size Z (i.e. $s=\lceil \log_2(Z) \rceil$), and secondly if this value appears to be greater or equal to Z, selects s–1 bits from the mother shifts at some other predefined s–1 positions.

In any of the preceding aspects, the lifting function firstly selects s least significant bits from the mother shift value, and secondly if this value appears to be greater or equal to Z, it selects s–1 least significant bits from the mother shifts.

In any of the preceding aspects, the circulant size is selected from one of $Z_{orig}$, $Z_{orig}+1$, $Z_{orig}+2$, . . . , $Z_{orig}+dZ_{max1}$, wherein $Z_{orig}$ is a minimal possible circulant size to encode the given number of information bits and $dZ_{max1}$ is a positive integer.

In any of the preceding aspects, the circulant size is selected from one of $Z_{orig}$, $GP2(Z_{orig}+1)$, $GP2(Z_{orig}+1)+1$, $GP2(Z_{orig}+1)+2$, . . . , $GP2(Z_{orig}+1)+dZ_{max2}$, wherein $Z_{orig}$ is a minimal possible circulant size to encode the given number of information bits, and wherein GP2(A) is a minimal power of 2 greater or equal to A and $dZ_{max1}$ is a positive integer.

In any of the preceding aspects, the circulant size is selected from one of $Z_{orig}$, $GP2(Z_{orig}+1)$, $GP2(Z_{orig}+1)*2$, $GP2(Z_{orig}+1)*4$, . . . $GP2(Z_{orig}+1)*2\hat{}dZ_{max3}$, wherein $Z_{orig}$ is a minimal possible circulant size to encode the given number of information bits, and wherein $dZ_{max3}$ is a positive integer.

In any of the preceding aspects, the circulant size is selected from one of $Z_{orig}$, $Z_{orig}+1$, $Z_{orig}+2$, . . . , $Z_{orig}+dZ_{max1}=$, $GP2(Z_{orig}+dZ_{max1}+1)$, $GP2(Z_{orig}+dZ_{max1}+1)+1$, $GP2(Z_{orig}+dZ_{max1}+1)+2$, . . . , and $GP2(Z_{orig}+dZ_{max1}+1)+dZ_{max2}$}, wherein $Z_{orig}$ is a minimal possible circulant size to encode the given number of information bits, wherein GP2(A) is a minimal power of 2 greater or equal to A, and wherein $dZ_{max1}$ and $dZ_{max2}$ are positive integers.

In any of the preceding aspects, the circulant size is selected from one of $Z_{orig}$, $Z_{orig}+1$, $Z_{orig}+2$, . . . , $Z_{orig}+dZ_{max1}$, $GP2(Z_{orig}+dZ_{max1}+1)*2$, $GP2(Z_{orig}+dZ_{max1}+1)*4$, . . . , $GP2(Z_{orig}+dZ_{max1}+1)*2\hat{}dZ_{max3}$, wherein $Z_{orig}$ is a minimal possible circulant size to encode the given number of information bits, wherein GP2(A) is a minimal power of 2 greater or equal to A, and wherein $dZ_{max1}$ and $dZ_{max3}$ are positive integers.

In any of the preceding aspects, the circulant size is selected from one of $Z_{orig}$, $Z_{orig}+1$, $Z_{orig}+2$, . . . , $Z_{orig}+dZ_{max1}$, $GP2(Z_{orig}+dZ_{max1}+1)$, $GP2(Z_{orig}+dZ_{max1}+1)+1$, $GP2(Z_{orig}+dZ_{max1}+1)+2$, . . . , $GP2(Z_{orig}+dZ_{max1}+1)+dZ_{max1}$, $GP2(Z_{orig}+dZ_{max1}+1)*2$, $GP2(Z_{orig}+dZ_{max1}+1)*4$, . . . , $GP2(Z_{orig}+dZ_{max1}+1)*2\hat{}dZ_{max3}$, wherein $Z_{orig}$ is a minimal possible circulant size to encode the given number of information bits, wherein GP2(A) is a minimal power of 2 greater or equal to A, and wherein $dZ_{max1}$, $dZ_{max2}$, and $dZ_{max3}$ are positive integers.

In any of the preceding aspects, circulant size, Z, is limited by a set of allowed values such that Z is in a form $n*2\hat{}s$ where n is a positive integer from a fixed set of integers and s is a non-negative integer, such that the options for Z are first 2 or more smallest numbers that have a form of $n*2\hat{}s$ and are greater or equal to $Z_{orig}$, wherein $Z_{orig}$ is a minimal possible circulant size to encode the given number of information bits.

In any of the preceding aspects, the circulant size is selected from one of $Z_{orig}$, $Z_{orig}+1$, $Z_{orig}+2$, and $Z_{orig}+3$, wherein $Z_{orig}$ is a minimal possible circulant size to encode the given number of information bits.

In any of the preceding aspects, the circulant size is selected from one of $Z_{orig}$ and $Z_{orig}+1$, wherein $Z_{orig}$ is a minimal possible circulant size to encode the given number of information bits.

In any of the preceding aspects, the circulant size is selected from one of $Z_{orig}$, $GP2(Z_{orig}+1)$, $GP2(Z_{orig}+1)+1$, $GP2(Z_{orig}+1)+2$, . . . , $GP2(Z_{orig}+1)+6$, wherein $Z_{orig}$ is a minimal possible circulant size to encode the given number of information bits, and wherein GP2(A) is a minimal power of 2 greater than or equal to A.

In any of the preceding aspects, the circulant size is selected from one of $Z_{orig}$, $GP2(Z_{orig}+1)$, $GP2(Z_{orig}+1)+1$, $GP2(Z_{orig}+1)+2$, $GP2(Z_{orig}+1)+3$, wherein $Z_{orig}$ is a minimal possible circulant size to encode the given number of information bits.

In any of the preceding aspects, the circulant size is selected from one of $Z_{orig}$ and $GP2(Z_{orig}+1)$, wherein $Z_{orig}$ is a minimal possible circulant size to encode the given number of information bits.

In any of the preceding aspects, the circulant size is selected from one of $Z_{orig}$, $Z_{orig}+1$, $Z_{orig}+2$, $Z_{orig}+3$, $GP2(Z_{orig}+1)$, $GP2(Z_{orig}+1)+1$, $GP2(Z_{orig}+1)+2$, and $GP2(Z_{orig}+1)+3$.

In any of the preceding aspects, the circulant size is selected from one of $Z_{orig}$, $Z_{orig}+1$, $Z_{orig}+2$, $Z_{orig}+3$, $GP2(Z_{orig}+4)$, $GP2(Z_{orig}+4)+1$, $GP2(Z_{orig}+4)+2$, $GP2(Z_{orig}+4)+3$.

In any of the preceding aspects, the circulant size is selected from one of $Z_{orig}$, $Z_{orig}+1$, $GP2(Z_{orig}+1)$, $GP2(Z_{orig}+1)+1$.

In any of the preceding aspects, the circulant size is selected from one of $Z_{orig}$, $Z_{orig}+1$, $GP2(Z_{orig}+2)$, $GP2(Z_{orig}+2)+1$.

In any of the preceding aspects, the circulant size is selected from one of $Z_{orig}$, $Z_{orig}+1$, $Z_{orig}+2$, $GP2(Z_{orig}+3)$, $GP2(Z_{orig}+3)+1$, $GP2(Z_{orig}+3)+2$, $GP2(Z_{orig}+3)+3$, $GP2(Z_{orig}+3)*2$.

In any of the preceding aspects, the circulant size is selected from one of a fixed number of options, and wherein the number of options is equal to 8, 4 or 2.

The content of the following references are incorporated herein by reference as if reproduced in their entirety:

R1-164007, "Flexibility of LDPC—Length, Rate and IR-HARQ", Samsung

R1-164697, "LDPC design overview", Qualcomm Incorporated

R1-1609584, "LDPC design for eMBB", Nokia, Alcatel-Lucent Shanghai Bell

Savin V. Split-extended LDPC codes for coded cooperation [C]//Information Theory and its Applications (ISITA), 2010 International Symposium on. IEEE, 2010: 151-156.

IEEE 802.11n™-2009, "Part 11: Wireless LAN Medium Access Control (MAC) and Physical Layer (PHY) Specifications Amendment 5: Enhancements for Higher Throughput."

IEEE 802.11ad™-2012, "Part 11: Wireless LAN medium access control (MAC) and physical layer (PHY) specifications. Amendment 3: Enhancements for very high throughput in the 60 GHz band.".

R1-1701384, "Chairman's Notes of Agenda Item 5.1.5 Channel coding".

Fossorier M. Quasi-Cyclic Low-Density Parity-Check Codes From Circulant Permutation Matrices TIT, V50(8), 2004, p. 1788-1793.

Channel Coding: Theory, Algorithms, and Applications by Marc Fossorier, David Declercq, Ezio Biglieri. Academic Press. July 2014.

R1-1701707, "Implementation aspects of LDPC codes", Huawei, HiSilicon.

R1-1701708, "Performance evaluation of LDPC codes," Huawei, HiSilicon.

T. J. Richardson and R. L Urbanke, "*Efficient encoding of low-density parity-check codes*", IEEE TRANSACTIONS ON INFORMATION THEORY, Volume 47, Issue 2, Pages 638-656, August 2002.

M. P. C. Fossorier et al., "Reduced Complexity Iterative Decoding of Low-Density Parity Check Codes Based on Belief Propagation", IEEE TRANSACTIONS ON COMMUNICATIONS, May 1999, Volume 47, Number 5, Pages 673-680.

J. Chen et al., "Improved min-sum decoding algorithms for irregular LDPC codes", PROCEEDINGS OF THE 2005 IEEE INTERNATIONAL SYMPOSIUM ON INFORMATION THEORY, Pages 449-453, September 2005.

Channel Coding: Theory, Algorithms, and Applications by Marc Fossorier, David Declercq, Ezio Biglieri. Academic Press. July 2014, p. 191.

Zhang, Xinmiao. *VLSI architectures for modern error-correcting codes*. CRC Press, 2015. pp. 189-224.

While the invention has been described primarily with reference to encoding data for wireless transmission, those of ordinary skill in the art will recognize that the invention is not limited to wireless transmission but may be applied to wired and optical transmission systems as well.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for encoding data, comprising:

receiving, by an apparatus configured to perform quasi-cyclic low density parity check (QC-LDPC) coding, a K-bit source word to be encoded using a QC-LDPC code;

selecting, by the apparatus, based on a bit length of the K-bit source word and a code rate to encode the K-bit source word, a circulant size Z from a plurality of circulant sizes and a lifting function from a plurality of lifting functions for generating a parity check matrix (PCM) of the QC-LDPC code, the circulant size Z being used to partition the PCM into a plurality of Z*Z matrices, and each of the plurality of Z*Z matrices being represented by a shift value, wherein the lifting function indicates a manner of generating shift values of the plurality of Z*Z matrices from a plurality of predetermined shift values;

generating, by the apparatus, the shift values of the plurality of Z*Z matrices from the plurality of predetermined shift values according to the circulant size Z using the lifting function to form the PCM;

encoding, by the apparatus, the K-bit source word using the PCM of the QC-LDPC code according to a LDPC coding technique, to generate an N-bit code word, wherein the N-bit code word comprises information of the K-bit source word and a parity check portion; and storing, by the apparatus, the N-bit code word in input/output memory.

2. The method of claim 1, wherein the circulant size Z is limited by a set of allowed values such that Z is in a form $n*2^s$, where n is a positive integer selected from a fixed set of integers and s is a non-negative integer, and the plurality of circulant sizes comprises first 2 or more smallest numbers that have the form of $n*2^s$ and that are greater than or equal to $Z_{orig}$, wherein $Z_{orig}$ is a minimal possible circulant size for use to encode a given number of information bits.

3. The method of claim 1, wherein selecting the circulant size Z and the lifting function is further based on a decoding parameter used for decoding the N-bit code word, wherein the decoding parameter comprises a type of a decoder to be used to decode the N-bit code word or a number of iterations for decoding the N-bit code word.

4. The method of claim 1, further comprising:
puncturing parity check bits of the PCM according to the code rate.

5. The method of claim 1, wherein the lifting function is configured to select a number of bits from a binary representation of the plurality of predetermined shift values at predefined positions of the plurality of predetermined shift values.

6. The method of claim 1, wherein the lifting function is configured to:
select first bits from a binary representation of the plurality of predetermined shift values at first predefined positions of the plurality of predetermined shift values; and
select second bits from the binary representation of the plurality of predetermined shift values at second predefined positions of the plurality of predetermined shift values, wherein the first bits and the second bits have same number of bits.

7. The method of claim 1, wherein the lifting function is configured to select bits from a binary representation of the plurality of predetermined shift values at different predefined positions.

8. The method of claim 7, wherein the lifting function is further configured to sum up bits selected at the different predefined positions.

9. The method of claim 8, the lifting function is further configured to
select a number of bits from bits resulted from summing up the bits selected at the different predefined positions.

10. The method of claim 1, where the lifting function is configured to select a fixed number of adjacent bits from a binary representation of the plurality of predetermined shift values.

11. The method of claim 1, wherein the lifting function is configured to select a fixed number of most significant bits from a binary representation of the plurality of predetermined shift values.

12. The method of claim 1, wherein the lifting functions is configured to select a fixed number of least significant bits from a binary representation of the plurality of predetermined shift values.

13. The method of claim 1, wherein the lifting function is configured to select s bits from a binary representation of the plurality of predetermined shift values at predefined s bit positions, wherein $s = \lceil \log_2(Z) \rceil$.

14. The method of claim 1, wherein the lifting function is configured to select s least significant bits from a binary representation of the plurality of predetermined shift values, and when s is greater than or equal to Z, select s−1 least significant bits from the binary representation of the plurality of predetermined shift values.

15. The method of claim 1, wherein the circulant size Z is selected from one of $Z_{orig}$, $Z_{orig}+1$, $Z_{orig}+2$, ..., $Z_{orig}+dZ_{max1}$, wherein $Z_{orig}$ is a minimal possible circulant size to use for encoding a predetermined number of information bits and $dZ_{max1}$ is a positive integer.

16. The method of claim 1, wherein the circulant size Z is selected from one of $Z_{orig}$, $GP2(Z_{orig}+1)$, $GP2(Z_{orig}+1)+1$, $GP2(Z_{orig}+1)+2$, $GP2(Z_{orig}+1)+dZ_{max2}$, wherein $Z_{orig}$ is a minimal possible circulant size to use for encoding a predetermined number of information bits, and wherein GP2(A) is a minimal power of 2 greater than or equal to A, and $dZ_{max1}$ is a positive integer.

17. The method of claim 1, wherein the circulant size Z is selected from one of $Z_{orig}$, $GP2(Z_{orig}+1)$, $GP2(Z_{orig}+1)*2$, $GP2(Z_{orig}+1)*4$, ... $GP2(Z_{orig}+1)*2^{dZ_{max3}}$, wherein $Z_{orig}$ is a minimal possible circulant size to use for encoding a predetermined number of information bits, and wherein $dZ_{max3}$ is a positive integer.

18. The method of claim 1, wherein the circulant size Z is selected from one of $Z_{orig}$, $Z_{orig}+1$, $Z_{orig}+2$, $Z_{orig}+dZ_{max1}$, $GP2(Z_{orig}+dZ_{max1}+1)$, $GP2(Z_{orig}+dZ_{max1}+1)+1$, $GP2(Z_{orig}+dZ_{max1}+1)+2$, ..., and $GP2(Z_{orig}+dZ_{max1}+1)+dZ_{max2}$}, wherein $Z_{orig}$ is a minimal possible circulant size to use for encoding a predetermined number of information bits, wherein GP2(A) is a minimal power of 2 greater than or equal to A, and wherein $dZ_{max1}$ and $dZ_{max2}$ are positive integers.

19. The method of claim 1, wherein the circulant size Z is selected from one of $Z_{orig}$, $Z_{orig}+1$, $Z_{orig}+2$, $Z_{orig}+dZ_{max1}$, $GP2(Z_{orig}+dZ_{max1}+1)*2$, $GP2(Z_{orig}+dZ_{max1}+1)*4$, ..., $GP2(Z_{orig}+dZ_{max1}+1)*2^{dZ_{max3}}$, wherein $Z_{orig}$ is a minimal possible circulant size to use for encoding a predetermined number of information bits, wherein GP2(A) is a minimal power of 2 greater than or equal to A, and wherein $dZ_{max1}$ and $dZ_{max3}$ are positive integers.

20. The method of claim 1, wherein the circulant size Z is selected from one of $Z_{orig}$, $Z_{orig}+1$, $Z_{orig}+2$, $Z_{orig}+dZ_{max1}$, $GP2(Z_{orig}+dZ_{max1}+1)$, $GP2(Z_{orig}+dZ_{max1}+1)+1$, $GP2(Z_{orig}+dZ_{max1}+1)+2$, ..., $GP2(Z_{orig}+dZ_{max1}+1)+dZ_{max2}$, $GP2(Z_{orig}+dZ_{max1}+1)*2$, $GP2(Z_{orig}+dZ_{max1}+1)*4$, $GP2(Z_{orig}+dZ_{max1}+1)*2^{dZ_{max3}}$, wherein $Z_{orig}$ is a minimal possible circulant size to use for encoding a predetermined number of information bits, wherein GP2(A) is a minimal power of 2 greater than or equal to A, and wherein $dZ_{max1}$, $dZ_{max2}$, and $dZ_{max3}$ are positive integers.

21. The method of claim 1, wherein the circulant size Z is selected from one of $Z_{orig}$, $Z_{orig}+1$, $Z_{orig}+2$, and $Z_{orig}+3$, wherein $Z_{orig}$ is a minimal possible circulant size to use for encoding a predetermined number of information bits.

22. The method of claim 1, wherein the circulant size Z is selected from one of $Z_{orig}$ and $Z_{orig}+1$, wherein $Z_{orig}$ is a minimal possible circulant to use for encoding a predetermined number of information bits.

23. The method of claim 1, wherein the circulant size Z is selected from one of $Z_{orig}$, $GP2(Z_{orig}+1)$, $GP2(Z_{orig}+1)+1$, $GP2(Z_{orig}+1)+2$, $GP2(Z_{orig}+1)+6$, wherein $Z_{orig}$ is a minimal possible circulant size to use for encoding a predetermined number of information bits, and wherein GP2(A) is a minimal power of 2 greater than or equal to A.

24. The method of claim 1, wherein the circulant size Z is selected from one of $Z_{orig}$, $GP2(Z_{orig}+1)$, $GP2(Z_{orig}+1)+1$, $GP2(Z_{orig}+1)+2$, $GP2(Z_{orig}+1)+3$, wherein $Z_{orig}$ is a minimal possible circulant size to use for encoding a predetermined number of information bits.

25. The method of claim 1, wherein the circulant size Z is selected from one of $Z_{orig}$ and $GP2(Z_{orig}+1)$, wherein $Z_{orig}$ is a minimal possible circulant size to use for encoding a predetermined number of information bits.

26. The method of claim 1, wherein the circulant size Z is selected from one of $Z_{orig}$, $Z_{orig}+1$, $Z_{orig}+2$, $Z_{orig}+3$, $GP2(Z_{orig}+1)$, $GP2(Z_{orig}+1)+1$, $GP2(Z_{orig}+1)+2$, and $GP2(Z_{orig}+1)+3$.

27. The method of claim 1, wherein the circulant size Z is selected from one of $Z_{orig}$, $Z_{orig}+1$, $Z_{orig}+2$, $Z_{orig}+3$, $GP2(Z_{orig}+4)$, $GP2(Z_{orig}+4)+1$, $GP2(Z_{orig}+4)+2$, and $GP2(Z_{orig}+4)+3$.

28. The method of claim 1, wherein the circulant size Z is selected from one of $Z_{orig}$, $Z_{orig}+1$, $GP2(Z_{orig}+1)$, and $GP2(Z_{orig}+1)+1$.

29. The method of claim 1, wherein the circulant size Z is selected from one of $Z_{orig}$, $Z_{orig}+1$, $GP2(Z_{orig}+2)$, and $GP2(Z_{orig}+2)+1$.

30. The method of claim 1, wherein the circulant size Z is selected from one of $Z_{orig}$, $Z_{orig}+1$, $Z_{orig}+2$, $GP2(Z_{orig}+3)$, $GP2(Z_{orig}+3)+1$, $GP2(Z_{orig}+3)+2$, $GP2(Z_{orig}+3)+3$, and $GP2(Z_{orig}+3)*2$.

31. The method of claim 1, wherein the circulant size Z is selected from one of a fixed number of options, and wherein the fixed number of the options is equal to 8, 4 or 2.

32. A network component, comprising:
a read only memory comprising at least one parity portion of a mother parity check matrix (PCM) and a lifting table, the lifting table comprises a plurality of circulant sizes with each circulant size corresponding to a lifting function for generating PCMs from the mother PCM for quasi-cyclic low density parity check (QC-LDPC) coding; and a parity bit generator configured to:
receive a source word to be encoded using a QC-LDPC code;
select, based on a bit length of the source word and a code rate used to encode the source word, a first circulant size Z and a first lifting function corresponding to the first circulant size Z from the lifting table for generating a first PCM of the QC-LDPC code, the first circulant size Z being used to partition the first PCM into a plurality of Z*Z matrices, and each of the plurality of Z*Z matrices being represented by a shift value, wherein the first lifting function indicates a manner of generating shift values of the plurality of Z*Z matrices from the mother PCM;
generate the shift values of the plurality of Z*Z matrices based on the at least one parity portion of the mother PCM according to the first circulant size Z and using the first lifting function to form the first PCM;
generate parity bits for the source word using the first PCM of the QC-LDPC code according to a LDPC coding technique; and
perform parity check of the source word using the parity bits to verify the source word.

33. A network component, comprising:
a read only memory comprising at least one parity portion of a mother parity check matrix (PCM) and a lifting table, the lifting table comprises a plurality of circulant sizes with each circulant size corresponding to a lifting function for generating PCMs from the mother PCM for quasi-cyclic low density parity check (QC-LDPC) coding;
an input/output memory; and
a check node processor configured to:
receive a N-bit code word that is generated from a K-bit source word encoded using a QC-LDPC code, wherein the N-bit code word comprises information of the K-bit source word and a parity check portion;
select, based on a bit length of the K-bit source word and a code rate used to encode the K-bit source word, a first circulant size Z and a first lifting function corresponding to the first circulant size Z from the lifting table for generating a first PCM of the QC-LDPC code, the first circulant size Z being used to partition the first PCM into a plurality of Z*Z matrices, and each of the plurality of Z*Z matrices being represented by a shift value, wherein the first lifting function indicates a manner of generating shift values of the plurality of Z*Z matrices from the mother PCM;
generate the shift values of the plurality of Z*Z matrices based on the at least one parity portion of the mother PCM according to the first circulant size Z and using the first lifting function to form the first PCM;
decode the N-bit code word using the first PCM according to a LDPC coding technique to generate the K-bit source word; and
store the K-bit source word in the input/output memory.

34. A method for decoding data, comprising:
receiving an N-bit code word that is generated from a K-bit source word encoded using a quasi-cyclic low density parity check (QC-LDPC) code, wherein the N-bit code word comprises information of the K-bit source word and a parity check portion;
selecting, based on a bit length of the K-bit source word and a code rate used to encode the K-bit source word, a first circulant size Z from a plurality of circulant sizes and a first lifting function from a plurality of lifting functions for generating a PCM of the QC-LDPC code, the first circulant size Z being used to partition the PCM into a plurality of Z*Z matrices, and each of the plurality of Z*Z matrices being represented by a shift value, wherein the first lifting function indicates a manner of generating shift values of the plurality of Z*Z matrices from a plurality of predetermined shift values;
generate the shift values of the plurality of Z*Z matrices from the plurality of predetermined shift values according to the first circulant size Z using the first lifting function to construct the PCM;
decoding the N-bit code word using the PCM to generate the K-bit source word; and
storing the K-bit source word in input/output memory.

* * * * *

UNITED STATES PATENT AND TRADEMARK OFFICE
CERTIFICATE OF CORRECTION

PATENT NO. : 10,594,339 B2  
APPLICATION NO. : 15/887148  
DATED : March 17, 2020  
INVENTOR(S) : Panteleev et al.

Page 1 of 1

It is certified that error appears in the above-identified patent and that said Letters Patent is hereby corrected as shown below:

In the Claims

In Column 29, Lines 41-42, Claim 16, delete "$Z_{orig}, GP2(Z_{orig}+1), GP2(Z_{orig}+1)+1, GP2(Z_{orig}+1)+2, GP2(Z_{orig}+1)+dZ_{max2}$," and insert --$Z_{orig}, GP2(Z_{orig}+1), GP2(Z_{orig}+1)+1, GP2(Z_{orig}+1)+2, ..., GP2(Z_{orig}+1)+dZ_{max2}$,--.

In Column 29, Line 54, Claim 18, delete "$Z_{orig}, Z_{orig}+1, Z_{orig}+2, Z_{orig}+dZ_{max1}$," and insert --$Z_{orig}, Z_{orig}+1, Z_{orig}+2, ..., Z_{orig}+dZ_{max1}$,--.

In Column 29, Line 63, Claim 19, delete "$Z_{orig}, Z_{orig}+1, Z_{orig}+2, Z_{orig}+dZ_{max1}$," and insert --$Z_{orig}, Z_{orig}+1, Z_{orig}+2, ..., Z_{orig}+dZ_{max1}$,--.

In Column 30, Line 4, Claim 20, delete "$Z_{orig}, Z_{orig}+1, Z_{orig}+2, Z_{orig}+dZ_{max1}$," and insert --$Z_{orig}, Z_{orig}+1, Z_{orig}+2, ..., Z_{orig}+dZ_{max1}$,--.

In Column 30, Line 20, Claim 22, delete "minimal possible circulant to use for encoding" and insert --minimal possible circulant size to use for encoding--.

In Column 30, Lines 23-24, Claim 23, delete "$Z_{orig}, GP2(Z_{orig}+1), GP2(Z_{orig}+1)+1, GP2(Z_{orig}+1)+2, GP2(Z_{orig}+1)+6$," and insert --$Z_{orig}, GP2(Z_{orig}+1), GP2(Z_{orig}+1)+1, GP2(Z_{orig}+1)+2, ..., GP2(Z_{orig}+1)+6$,--.

Signed and Sealed this  
Eleventh Day of August, 2020

Andrei Iancu  
*Director of the United States Patent and Trademark Office*